United States Patent [19]
Reynar et al.

[11] Patent Number: 5,951,623
[45] Date of Patent: Sep. 14, 1999

[54] LEMPEL- ZIV DATA COMPRESSION TECHNIQUE UTILIZING A DICTIONARY PRE-FILLED WITH FREQUENT LETTER COMBINATIONS, WORDS AND/OR PHRASES

[76] Inventors: Jeffrey C. Reynar, 1053 Church St., Abington, Pa. 19001; Fred Herz, Condominium 304, Herzwoods, Canaan Valley, Davis, W. Va. 26260; Jason Eisner, 1015 Spruce St., Philadelphia, Pa. 19107; Lyle Ungar, 321 S. 20th St., Philadelphia, Pa. 19103

[21] Appl. No.: 08/692,474
[22] Filed: Aug. 6, 1996
[51] Int. Cl.$^6$ .............................. G06F 7/00; G06F 15/00; H03M 7/00
[52] U.S. Cl. .............................. 708/203; 341/51; 341/87; 341/95; 341/106; 358/426
[58] Field of Search ........................ 364/715.02; 341/50, 341/51, 59, 60, 81, 82, 87, 95, 106, 55; 358/426, 261.1; 382/232

[56] References Cited

U.S. PATENT DOCUMENTS

| | | | |
|---|---|---|---|
| 4,386,416 | 5/1983 | Giltner et al. | 364/900 |
| 4,464,650 | 8/1984 | Eaastman et al. | 340/347 |
| 4,558,302 | 12/1985 | Welch | 340/347 |
| 4,672,679 | 6/1987 | Freeman | 382/40 |
| 4,701,745 | 10/1987 | Waterworth | 340/347 |
| 4,814,746 | 3/1989 | Miller et al. | 341/95 |
| 4,847,619 | 7/1989 | Kato et al. | 341/106 |
| 4,876,541 | 10/1989 | Storer | 341/51 |
| 4,881,075 | 11/1989 | Weng | 341/87 |
| 4,906,991 | 3/1990 | Fiala et al. | 341/51 |

(List continued on next page.)

OTHER PUBLICATIONS

Rodeh et al., "Linear Algorithm for Data Compression via String Matching", *J. of the Assoc. For Computing Machinery*, 1981, 28(1), 16–24.

Storer, J.A. et al., "Data Compression via Textual Substitution", *J. of the Assoc. for Computing Machinery*, 1982, 29, 928–951.

Welch, T.A., "A Technique for High–Performance Data Compression", *IEEE*, 1984, 8–19.

Zipf, G., Human Behavior and the Principle of Least Effort, 1949.

Ziv J. et al., "A Universal Algorithm for Sequential Data Compression", *IEEE Trans. On Information Theory*, 1977, IT–23(3), 337–343.

(List continued on next page.)

*Primary Examiner*—Emmanuel L. Moise
*Attorney, Agent, or Firm*—Woodcock Washburn Kurtz Mackiewicz & Norris LLP

[57] ABSTRACT

An adaptive compression technique which is an improvement to Lempel-Ziv (LZ) compression techniques, both as applied for purposes of reducing required storage space and for reducing the transmission time associated with transferring data from point to point. Pre-filled compression dictionaries are utilized to address the problem with prior Lempel-Ziv techniques in which the compression software starts with an empty compression dictionary, whereby little compression is achieved until the dictionary has been filled with sequences common in the data being compressed. In accordance with the invention, the compression dictionary is pre-filled, prior to the beginning of the data compression, with letter sequences, words and/or phrases frequent in the domain from which the data being compressed is drawn. The letter sequences, words, and/or phrases used in the pre-filled compression dictionary may be determined by statistically sampling text data from the same genre of text. Multiple pre-filled dictionaries may be utilized by the compression software at the beginning of the compression process, where the most appropriate dictionary for maximum compression is identified and used to compress the current data. These modifications are made to any of the known Lempel-Ziv compression techniques based on the variants detailed in 1977 and 1978 articles by Ziv and Lempel.

68 Claims, 14 Drawing Sheets

U.S. PATENT DOCUMENTS

| | | | |
|---|---|---|---|
| 4,988,998 | 1/1991 | O'Brien | 341/58 |
| 5,001,478 | 3/1991 | Nagy | 341/67 |
| 5,003,307 | 3/1991 | Whiting et al. | 341/51 |
| 5,016,009 | 5/1991 | Whiting et al. | 341/67 |
| 5,023,610 | 6/1991 | Rubow et al. | 341/51 |
| 5,049,881 | 9/1991 | Gibson et al. | 341/95 |
| 5,058,137 | 10/1991 | Shah | 375/94 |
| 5,087,913 | 2/1992 | Eastman | 341/95 |
| 5,126,739 | 6/1992 | Whiting et al. | 341/106 |
| 5,140,321 | 8/1992 | Jung | 341/55 |
| 5,153,591 | 10/1992 | Clark | 341/51 |
| 5,155,484 | 10/1992 | Chambers, IV | 341/55 |
| 5,179,378 | 1/1993 | Ranganathan et al. | 341/51 |
| 5,243,341 | 9/1993 | Seroussi et al. | 341/51 |
| 5,262,776 | 11/1993 | Kutka | 341/51 |
| 5,373,290 | 12/1994 | Lempel et al. | 341/51 |
| 5,455,576 | 10/1995 | Clark, II et al. | 341/50 |
| 5,485,526 | 1/1996 | Tobin | 382/232 |
| 5,561,421 | 10/1996 | Smith et al. | 341/51 |

OTHER PUBLICATIONS

Ziv, J. et al., "Compression of Individual Sequences via Variable-Rate Coding", *IEEE Trans. On Information Theory*, 1978, IT-24(5), 530–536.

Bell et al., "Text Compression", 1990, Englewood Cliffs, New Jersey, Prentice Hall.

Bell, T.C., "Better OPM/L Text Compression", *IEEE Trans. on Comm.*, 1986, COM-34(12), 1176–1182.

Bell et al., "Adaptive Dictionary Encoders: Ziv–Lempel Coding", Dictionary Techniques, Chap. 8, 214–234.

Bentley, J. L. et al., "A Locally Adaptive Data Compression Scheme", *Comm. of ACM*, 1986, 29(4), 320–330.

Huffman, D.A., "A Method for the Construction of Minimum–Redundancy Codes", *Proceedings of the I.R.E.*, 1952, 40, 1098–1101.

Langdon Jr., G.G., "A Note on the Ziv–Lempel Model for Compressing Individual Sequences", *IEEE Trans. On Information Theory*, 1983, 29(2), 284–287.

Marcus et al., "Building a Large Annota Corpus of English: The Penn Treebank", *Computational Linguistics*, 1993, 19(2), 313–330.

Miller, V.S. et al., "Variations on a Theme by Ziv and Lempel" in Combinatorial Algorithms on Words, NATO ASI Series, Apostolico, A. and Galil, Z., eds., 1985, vol. F12, 131–140.

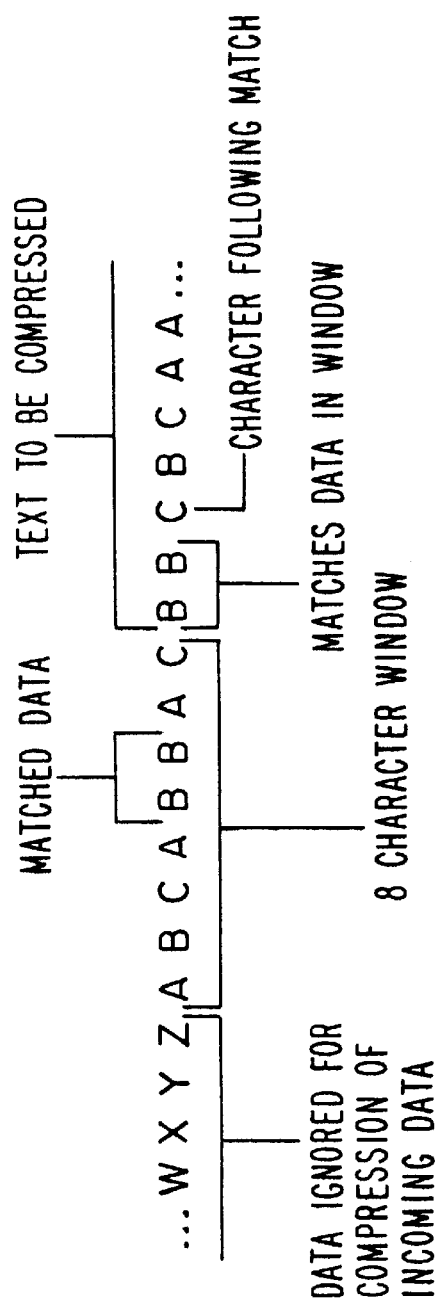
Fig. 1(A) PRIOR ART LZ77 TEXT COMPRESSION
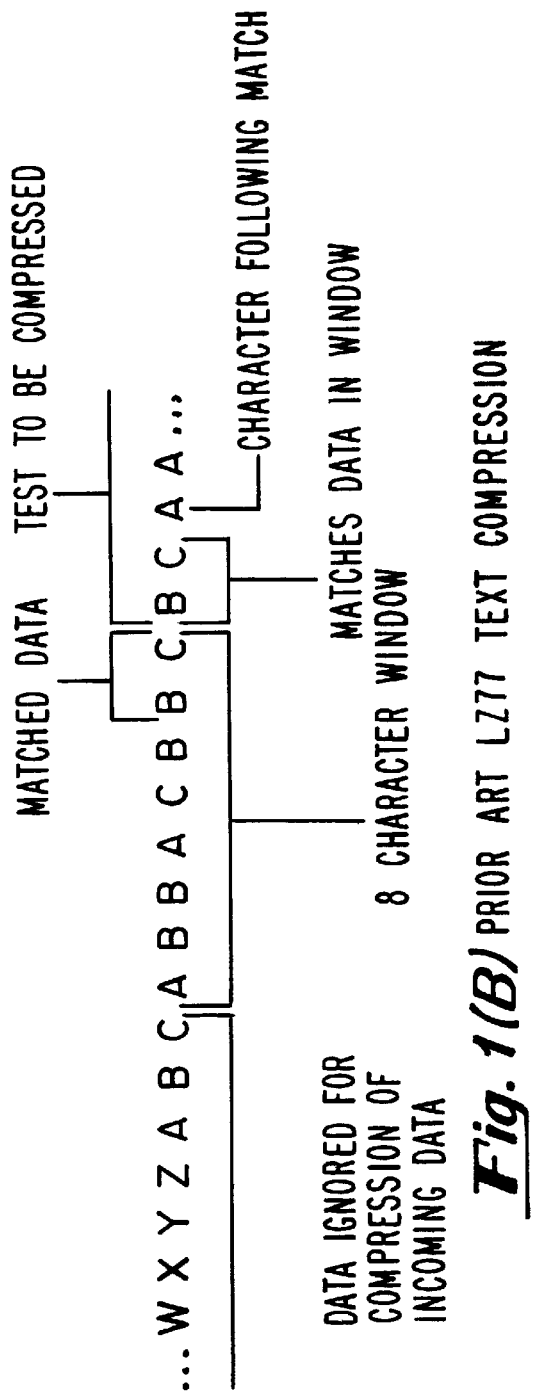
Fig. 1(B) PRIOR ART LZ77 TEXT COMPRESSION

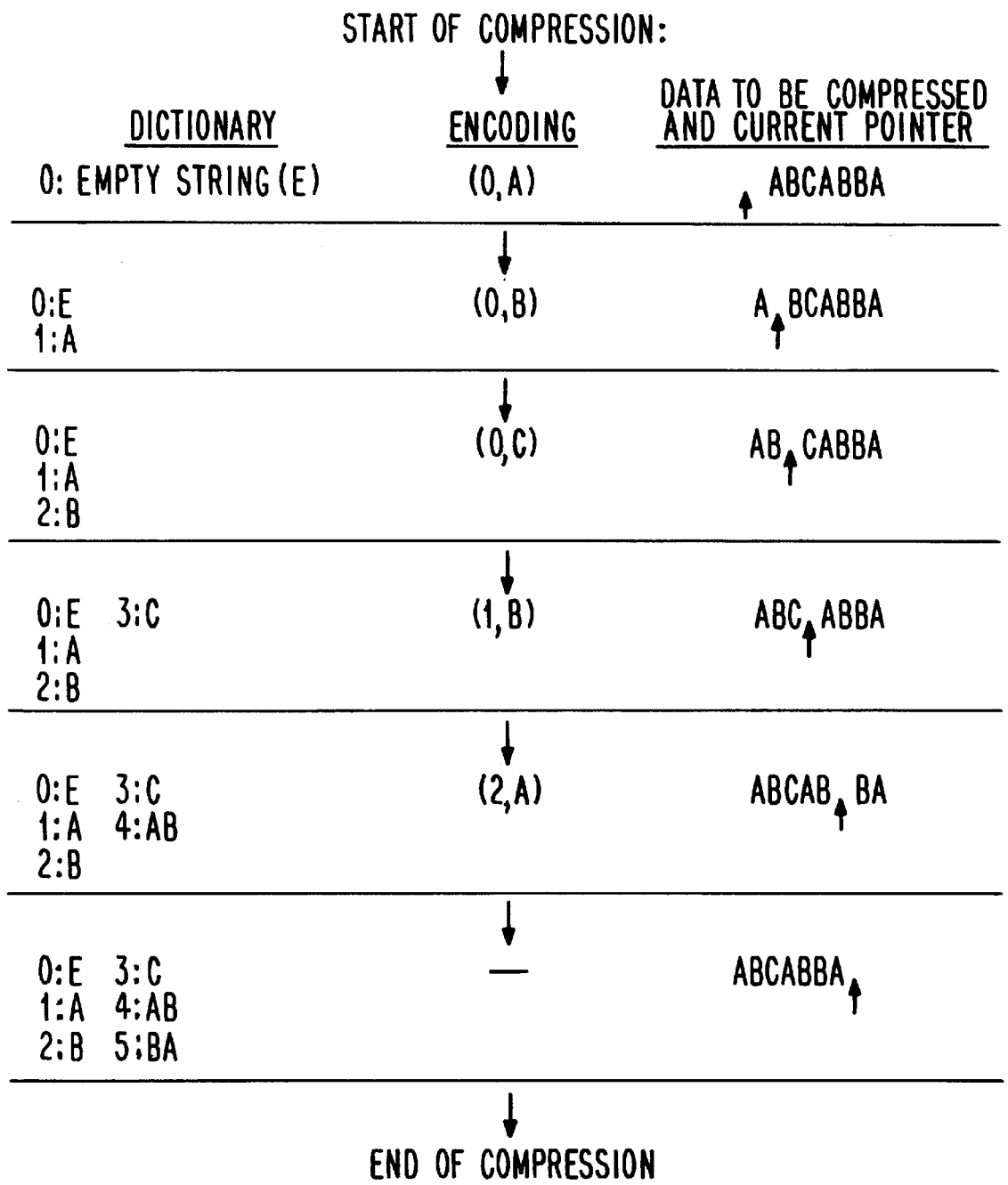
Fig. 2 PRIOR ART LZ78 TEXT COMPRESSION

| DICTIONARY | ENCODING | DATA TO BE COMPRESSED AND CURRENT POINTER |
|---|---|---|
| | START OF COMPRESSION: ↓ | |
| 0:A<br>1:B<br>2:C | (0) | ↓ABCABBA |
| AS ABOVE | (1) | A↑BCABBA |
| 0:A<br>1:B<br>2:C<br>3:AB | (2) | AB↑CABBA |
| 0:A    4:BC<br>1:B<br>2:C<br>3:AB | (3) | ABC↑ABBA |
| 0:A    4:BC<br>1:B    5:CAB<br>2:C<br>3:AB | (1) | ABCAB↑BA |
| 0:A    4:BC<br>1:B    5:CAB<br>2:C    6:ABB<br>3:AB | (0) | ABCABB↑A |
| 0:A    4:BC<br>1:B    5:CAB<br>2:C    6:ABB<br>3:AB  7:BA | — | ABCABBA↑ |
| | ↓ END OF COMPRESSION | |

Fig. 3 PRIOR ART L_MW TEXT COMPRESSION (COMPRESSED DATA OPTIONS)

(DICTIONARY CREATION)

(LZ78 COMPRESSION USING PRE-FILLED DICTIONARY)

(LZ78 DECOMPRESSION USING PRE-FILLED DICTIONARY)

Fig. 11 LZ78 TEXT COMPRESSION WITH PRE-FILLED DICTIONARY (LZ77/LZ78 HYBRID COMPRESSION USING PRE-FILLED DICTIONARY)

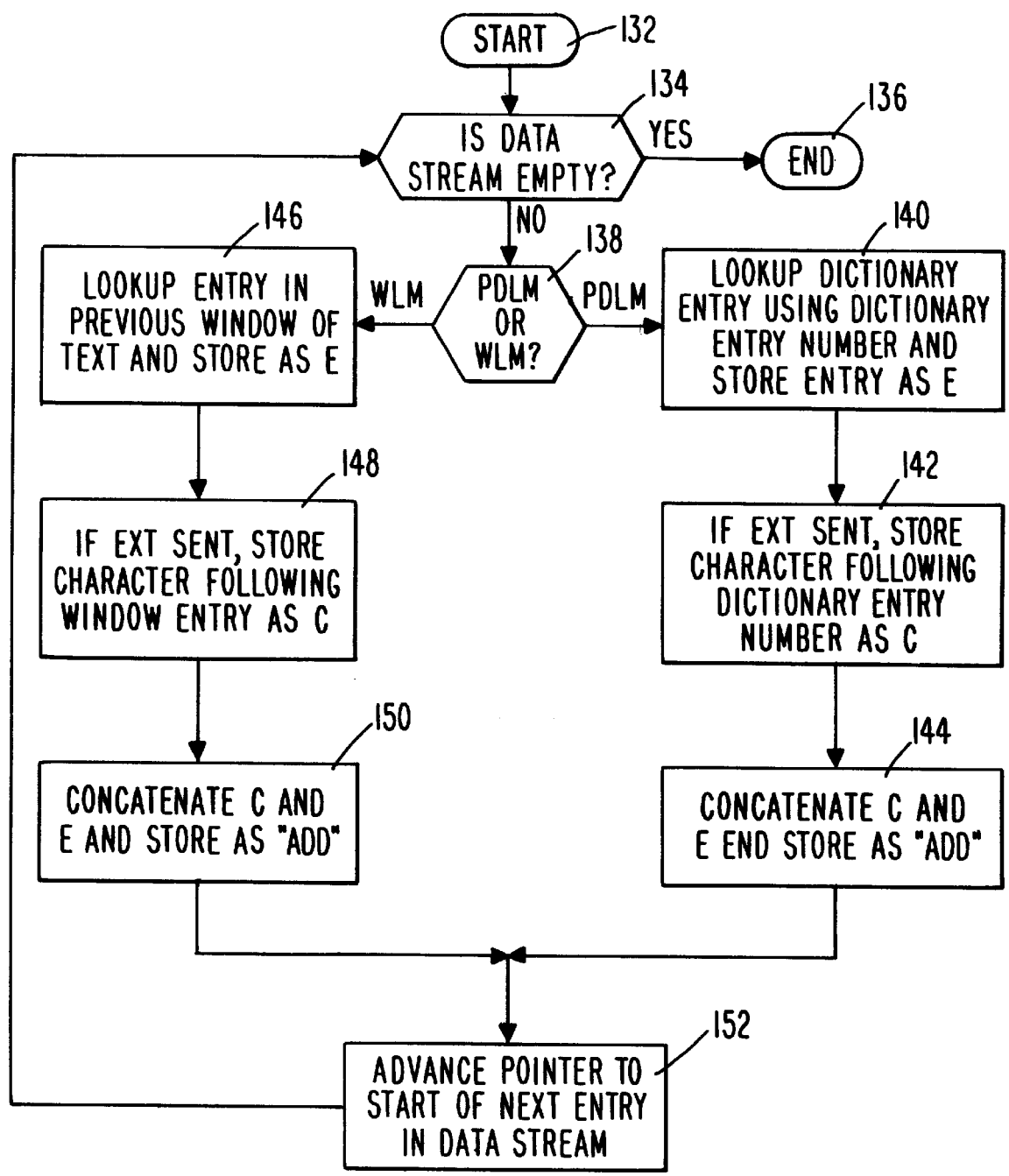
_Fig. 13_
(LZ77/LZ78 HYBRID DECOMPRESSION USING PRE-FILLED DICTIONARY)

PRE-FILLED DICTIONARY INITIALLY CONTAINS
(CONTENTS OF ALPHABET AND FREQUENT SEQUENCES):

| ENTRY # | ENTRY |
|---------|-------|
| D0: | ABC |
| D1: | DEF |
| ⋮ | ⋮ |

TEXT TO BE COMPRESSED:
ABCBDEFGABC

START OF COMPRESSION:

| STEP | ENCODING | METHOD | DATA TO BE COMPRESSED AND CURRENT POINTER |
|------|----------|--------|-------------------------------------------|
| 0 | D0 | DICTIONARY | ↑ABCBDEFGABC |
| 1 | ⟨2,1⟩ | LZ77 REFERENCE | ABC↑BDEFGABC |
| 2 | D1 | DICTIONARY | ABCB↑DEFGABC |
| 3 | G | LZ77 LITERAL | ABCBDEF↑GABC |
| 4 | D0 | DICTIONARY | ABCBDEFG↑ABC |
| COMPLETE | | | ABCBDEFGABC↑ |

END OF COMPRESSION

*Fig. 14*

LEMPEL-ZIV TEXT COMPRESSION
USING A HYBRID OF LZ77 AND LZ78
COMPRESSION WITH A PRE-FILLED DICTIONARY

LEMPEL- ZIV DATA COMPRESSION TECHNIQUE UTILIZING A DICTIONARY PRE-FILLED WITH FREQUENT LETTER COMBINATIONS, WORDS AND/OR PHRASES

BACKGROUND OF THE INVENTION

1. Field of the Invention

The present invention relates to a method and apparatus for compressing and decompressing textual data stored in digital form in a lossless manner. In other words, the original data is reconstructed in its original form after having first undergone the compression and then the decompression processes. The data is assumed to be drawn from a particular alphabet which is specified in advance, such as the ASCII code, which consists of a 7 or 8 bit representation of a particular set of characters.

2. Description of the Prior Art

Many different types of text compression techniques are described in the prior art. The text compression techniques described herein are based on the text compression techniques developed by Lempel and Ziv, who developed two techniques for text compression which are similar but have important differences. These two methods were outlined in papers entitled "A Universal Algorithm for Sequential Data Compression," *IEEE Transactions on Information Theory*, Vol. IT-23, No. 3, pp. 337–343, and "Compression of Individual Sequences via Variable-Rate Coding," *IEEE Transactions on Information Theory*, Vol. IT-24, No. 5, pp. 530–536, and are referred to commonly as LZ77 and LZ78, respectively.

LZ77 is a text compression technique in which pointers to previously compressed material within a fixed size window are used to compress new material. The fixed size "compression window" is moved across the text data as it is being compressed to exploit the principle of locality, i.e., that data is likely to be most similar to proximal data. An example of LZ77 will now be described with respect to FIGS. 1(A) and 1(B).

In FIGS. 1(A) and 1(B), a small window size of 8 characters is assumed for illustrative purposes. As shown in FIG. 1(A), the text that has not yet been compressed is compared to the contents of the (up to) 8 character window containing the (up to) 8 characters of the compressed text immediately preceding the text which has not yet been compressed. The longest match starting at the beginning of the text which has not yet been compressed with a sequence in the 8 character window is identified. In FIG. 1(A), the longest match from the 8 character window is "BB." A pointer to this sequence ("BB"), its length (2), and an extension (the next character after the match in the text to be compressed) are then either transmitted or compressed and stored locally, depending on the application of the data compression algorithm. However, if no matching sequence is found in the 8 character window, then a literal character is transmitted. Once the block of data pointed to by the pointer has been compressed and the information regarding its compression has been transmitted, the window is moved by the number of characters referred to by the pointer (BB) plus the extension, if any. In addition, the pointer to the region of text being compressed is updated by this number of characters. As illustrated in FIG. 1(B), this process repeats for the shifted data until the data being compressed is exhausted.

LZ78 differs from LZ77 in that the text compression is achieved by parsing the data being compressed into phrases which are entered into a compression dictionary. Pointers to these phrases or dictionary entries are then used to compress new data. Initially, the dictionary contains only an empty string (phrase of length zero). The phrase to be compressed, at each step, is the longest phrase at the start of the new data such that the prefix of this phrase is an entry in the dictionary, where the prefix is defined to be the phrase with its final character removed. The remaining character is called the extension. Thus, when the first phrase is seen, it is encoded as a reference to a dictionary entry consisting of the empty string (which is the only entry initially found in the dictionary), followed by the last and only character of the phrase. This character is then placed in the dictionary (assuming the dictionary is not full), and the process of identifying a phrase and transmitting its prefix (as a reference to the dictionary entry matching the prefix) and extension is repeated. The not yet compressed data will then be compared to both dictionary entries: the empty string and the phrase consisting of the already encountered character. If the next character in the new data does not match the already compressed character, then it, too, will be compressed as the empty string plus the character being compressed. In this way, each phrase of the data is compressed as a prefix, which is found in the dictionary and is chosen to be as long as possible, and an extension, which is the character which follows the prefix in the input data. An example of LZ78 will now be described with respect to FIG. 2.

FIG. 2 shows a sample of LZ78 compression for a short string of characters. As shown, the dictionary initially starts with no entries aside from the empty string, which is referred to as $\in$, and a pointer indicating the start of the character sequence to be compressed is placed at the beginning of the sequence to be compressed. The longest initial phrase whose prefix is in the dictionary is one character long, since the prefix of this phrase, namely $\in$, is the only entry in the dictionary. The first character is therefore encoded as a reference to $\in$ and the first character of the sequence being transmitted. Then, the dictionary is updated to contain the entry consisting of the concatenation of the used dictionary entry and the character following it in the compression sequence. The current pointer is then moved by the number of characters compressed, and the process repeats itself, repeatedly identifying the next phrase and transmitting a compressed version of it, until the stream of data to be compressed is empty. As will be appreciated by those skilled in the art, the LZ78 technique provides substantially more compression once the dictionary is formed. A more detailed description of a particular implementation of the LZ78 text compression technique is given in U.S. Pat. No. 4,464,650—Eastman et al., while a good general description of Lempel-Ziv coding techniques may be found in the text entitled "*Text Compression*," Bell et al., Englewood Cliffs, N.J., Prentice Hall, 1990.

Numerous data compression systems have been described in the prior art which utilize the concept of a compression dictionary as described by Lempel and Ziv.

For example, Giltner et al. describe in U.S. Pat. No. 4,386,416 a system for use in transmitting data over a Telex or similar network. The system described by Giltner et al. uses two dictionaries. The first is pre-filled with frequent words from the data's language, while the second dictionary is initially empty and is filled with words which are encountered in the data but which are not present in the first dictionary. When transmitting data, if a word is found in the first dictionary, an escape code and the number of the word's entry in the first dictionary are transmitted. If a word is not found in the first dictionary, it is compressed using Huffman coding and it is added to the second dictionary for later use. As a result, if the word is encountered again, it can be transmitted by sending an escape code indicating that the number of the word's entry in the second dictionary refers to the second dictionary, followed by the number of the word's entry in the second dictionary. Giltner et al. define a "word" to be either a predetermined number of characters or a sequence of characters surrounded by white space or a combination of white space and punctuation. A small, but fixed number of words common to all the types of messages handled by the Telex or similar network is provided in the first dictionary, and additional "words" are stored in the second dictionary. However, Giltner et al. do not address frequently occurring sequences of text which fall outside the limited definition of a valid word. As a result, Giltner et al. do not take advantage of the fact that the similarity of texts is greater when the comparison between them is made at the level of character sequences. Also, Giltner et al. do not address how words which occur frequently in the text can be chosen for the first dictionary whereby it is filled with valid words which are frequent within the type of text being transmitted. Giltner et al. also fail to teach how to identify the most appropriate library of text or the identification of the genre of the document to be compressed. Furthermore, Giltner et al.'s library is fixed; users cannot create their own pre-filled dictionaries as needed.

Similarly, Weng describes in U.S. Pat. No. 4,881,075 an "adaptive" data compression technique which uses two dictionaries. The first dictionary is used to perform compression or decompression while the second is being rebuilt to better reflect the local characteristics of the most recent input data. The second dictionary is then used to compress and decompress the input data while the first dictionary is being rebuilt using the most current input data. Weng repeatedly switches between dictionaries until compression is completed.

Kato et al. describe in U.S. Pat. No. 4,847,619 a modification to adaptive compression techniques in which the compression system's degree of compression is monitored and the dictionary is reset when the degree of compression drops below a threshold. The reset is not permitted to occur before the dictionary is sufficiently full in order to prevent the dictionary from resetting prematurely. This technique could be used in conjunction with a LZ compression technique, or any other adaptive technique.

In U.S. Pat. No. 5,153,591, Clark describes a modification to the Lempel-Ziv compression algorithm in which the dictionary is stored as a tree data structure. This allows large dictionaries to be stored in less space than in the original embodiment described in U.S. Pat. No. 4,464,650. In addition, it allows these dictionaries to be searched more easily and more quickly.

In U.S. Pat. No. 5,243,341, Seroussi et al. outline a Lempel-Ziv variant in which two dictionaries are used. The first dictionary is used until it is filled, then it is replaced with a standby dictionary, which is filled with those entries from the first dictionary which yield the most compression before compression continues.

Many other modifications to the original Lempel-Ziv compression techniques appear in the prior art.

For example, Welch describes in U.S. Pat. No. 4,558,302 an implementation of Lempel-Ziv in which the encoding and decoding processes require less complicated computation and, therefore, are faster than in the implementation described in U.S. Pat. No. 4,464,650—Eastman et al.

Miller et al. suggest in U.S. Pat. No. 4,814,746 several modifications to the Lempel-Ziv algorithm. The first of these modifications is to include all possible characters in the dictionary before compression actually begins. As a result, it is not necessary to transmit a flag which indicates that the following datum is a character rather than a pointer. In addition, Miller et al. also associate a time stamp with each dictionary entry in order to facilitate the removal of the least recently used entry when the dictionary becomes full. These modifications are aimed at reducing the memory requirements by limiting the dictionary to a fixed size and improving compression by allowing the dictionary to more accurately reflect the current characteristics of the data being compressed.

Storer describes in U.S. Pat. No. 4,876,541 a compression technique which does not suffer from some of the same difficulties as prior Lempel-Ziv techniques. In particular, unencoded characters never need to be transmitted, since the compression dictionary initially contains all of the characters in the alphabet, as in U.S. Pat. No. 4,814,746—Miller et al. In addition, a least recently used queue is maintained so that the dictionary can be purged of less useful entries. The encoding and decoding dictionary in Storer's system can vary in size, and there may be several active at a time. The compression ratio of each of the dictionaries is monitored, and the one which yields the best compression is used.

In U.S. Pat. No. 4,906,991, Fiala et al. describe a substitution style data compression technique which is somewhat similar to Lempel-Ziv compression. Their technique relies on searching a fixed window of characters (e.g. 4096 characters) which have already been compressed in order to determine whether the text being compressed can be encoded as a pointer to a location within the window. If the text being compressed can be encoded in this manner, a pointer to the starting location, along with the length of the overlap between the text being compressed and the location within the window is generated. If the text being compressed cannot be encoded in this manner, it is encoded as a length followed by a literal string of that length. Like LZ78 compression, this technique fails to compress data much at the beginning of documents, since the window is devoid of strings which can be pointed to in order to bring about compression.

O'Brien suggests in U.S. Pat. No. 4,988,998 modifications to the Lempel-Ziv algorithm which allow for enhanced compression of data which contains long strings of repeated characters. Since the Lempel-Ziv algorithm adds entries to the compression dictionary by appending a single character to an existing dictionary entry, it will take many occurrences of a repeated string of characters before such strings are found in the dictionary. Accordingly, O'Brien preprocesses the data using a run-length encoding technique in which the run-lengths are inserted into the text. The resulting combination of text and run-lengths for repeated characters is then compressed using the Lempel-Ziv technique.

In U.S. Pat. No. 5,049,881, Gibson et al. describe a data compression system which creates its own pointers from the sequence of characters previously processed and emphasizes maximizing the product of the data rate and the compression ratio. Thus, previously input data is used as the dictionary and is combined with a hashing algorithm to find candidates for string matches without the requirement of a string matching table.

In U.S. Pat. No. 5,058,137, Shah describes a Lempel-Ziv decoder which has memories for storing code words and data separately. Upon receipt of a code word, the decoder stores the previously received code word, applies the newly received code word to the code word memory to obtain the location of the last data element which is part of the data represented by the newly received code word, and another code word associated with the prefix. Upon completion of decoding the latest code word, the first data element of the decoded word is appended to the next previously received code word, and the combination is stored as the equivalent of a code word which is next after the highest code word already received. At least one memory is shared for use during encoding and decoding.

In U.S. Pat. No. 5,087,913, Eastman describes a Lempel-Ziv algorithm which uses a searchtree database to allow later portions of the data to be decompressed without having to decompress all preceding portions. The searchtree database is grown to a fixed, predetermined size and is allowed to grow no further. The fact that the compression searchtree database is established in advance of decompression allows decompression of portions of the data without decompressing the entire preceding portion of the data.

In U.S. Pat. No. 5,140,321, Jung details a Lempel-Ziv modification which allows for enhanced compression speed at the cost of a reduction in compression. Rather than attempting to find the optimal matching substring in the entire compressed portion of the data, the principle of locality is exploited and only the most recent compressed data in a first-in-first-out buffer is examined to find a matching sequence. A hash table is used to store the strings which have been compressed recently and to allow for fast retrieval of matching strings.

In U.S. Pat. No. 5,179,378, Ranganathan et al. describe a Lempel-Ziv implementation which uses a systolic array of processors to improve performance by forming fixed-length codewords from a variable number of data symbols.

In U.S. Pat. No. 5,262,776, Kutka describes an implementation of the Lempel-Ziv algorithm which takes advantage of a tree data structure to avoid the search step normally required by the compression process. The sequence of elements in a primary sequence is converted into elements in a reduced set of elements using escape sequences. This technique is particularly suited to compressing data representing the coefficients of a discrete cosine transform of an image.

In addition to the above modifications to the Lempel-Ziv compression technique which are described in the patent literature, others appear in technical journals.

For example, in "Linear Algorithm for Data Compression via String Matching," Rodeh et al. describe a modification to the LZ77 technique in which the size of the window is not fixed. As a result, pointers to previous strings in the compressed portion of the data grow in length and are encoded in a variable-length code.

In "Better OPM/L Text Compression," Bell describes a Lempel-Ziv variant referred to as LZSS in which not all compression is done using a combination of a prefix and an extension. Instead, if the cost of transmitting a pointer is higher than that of merely transmitting a character or sequence of characters, then the character or sequence of characters is transmitted. A binary search tree is used to find the longest string match, without a limit on the length of the match.

In "A Technique for High-Performance Data Compression," Welch describes a modification to LZ78 in which only pointers to previously compressed data are used, rather than a combination of pointers and characters. A string table is formed which maps strings of input characters into fixed-length codes. For every string in the table, its prefix string is also in the table. The string table contains strings that have been encountered previously in the message being compressed. It consists of a running sample of strings in the message so that available strings reflect the statistics of the message. This technique is commonly referred to as LZW. It uses a "greedy" parsing algorithm in which the input string is examined character-serially in one pass, and the longest recognized input string is parsed off each time. The strings added to the string table are determined by this parsing.

In "Variations on a Theme by Ziv and Lempel," Miller and Wegman describe another variant of LZ78. In their version, the dictionary is filled in advance with all strings of length 1 (that is, all of the characters in the alphabet over which compression is taking place), which helps to reduce, but does not eliminate the problem of starting with a dictionary devoid of useful entries. Also, rather than reset the compression dictionary when it becomes full, they propose to delete strings from the dictionary which were least recently used. However, the largest contribution of their version, which will be referred to as LZMW, is that extensions are never transmitted. Rather, since the dictionary begins with all strings of length 1, it is possible to encode all of the data using the initial dictionary. However, this would result in no compression. Instead, the dictionary is grown by adding entries to the dictionary which consist of the concatenation of the previous two matches.

In FIG. 3, a sample of LZMW compression is shown. The alphabet is assumed to contain only 3 characters (A,B,C) for purposes of illustration. As shown, the compression dictionary initially contains the characters of the alphabet. The pointer to the character at which compression will begin is placed at the first character in the sequence of text being compressed. The longest match within the dictionary is found and a pointer to this entry is transmitted. Alternatively, the pointer may be stored locally depending on the application of the compression algorithm. The pointer is then moved by the number of characters transmitted. Normally, the dictionary is updated to contain the concatenation of the two previously transmitted dictionary entries, but since there was no previous transmission, this step is skipped. On the second iteration through the processing cycle, the largest match is found, its dictionary entry number is transmitted, the pointer is moved by the appropriate number of characters, and the concatenation of the two previous dictionary entries transmitted is added to the dictionary as a new entry. This process then repeats until the data to be compressed has been exhausted.

Commonly used compression algorithms also use variations of the LZ77 and LZ78 algorithms. For example, the compression algorithm used in commercially available "zip" and freely available "gzip" is a variation of LZ77 which finds duplicated strings in the input data. In "gzip," the second occurrence of a string is replaced by a pointer to the previous string in the form of a pair (distance, length). When a string does not occur anywhere in the previous number of bytes within a designated distance, such as 32 Kbytes, it is transmitted as a sequence of literal bytes. Literals or match lengths are compressed with one Huffman tree, and match distances are compressed with another tree. The trees are stored in a compact form at the start of each block. The blocks can have any size, except that the compressed data for one block must fit in available memory. A block is terminated when "gzip" determines that it would be useful to start another block with fresh trees. Duplicated strings are found using a hash table. All input strings of length 3 are inserted in the hash table, and a hash index is computed for the next 3 bytes. If the hash chain for this index is not empty, all strings in the chain are compared with the current input string, and the longest match is selected. The hash chains are searched, starting with the most recent strings, to favor small distances and thus take advantage of the Huffman coding. The hash chains are singly linked. There are no deletions from the hash chains; the algorithm simply discards matches that are too old. To avoid a worst-case situation, very long hash chains are arbitrarily truncated at a certain length as determined by a runtime option. As a result, "gzip" does not always find the longest possible match but generally finds a match which is long enough.

Unfortunately, despite the large number of Lempel-Ziv variants in the prior art, none adequately addresses the problem that beginning with a dictionary completely devoid of words virtually prevents small files from being compressed at all and prevents larger files from being compressed further. U.S. Pat. Nos. 4,814,746 and 4,876,541 and the work of Miller and Wegman begin to address this problem by beginning with a dictionary containing all of the characters in the character set in which the data is encoded. This solves the problem of needing to transmit escape codes to indicate that what follows is not a dictionary entry number, but a character.

However, the present inventors have found that further compression may be obtained by observing that many documents, especially those textual documents written in either natural human languages or computer programming languages, such as English or C, have a small number of words which are statistically extremely frequent and which should be part of the compression dictionary. Zipf has shown this to be true for language in a book entitled *Human Behavior and the Principle of Least Effort*. In fact, the frequency of words in English obeys what has come to be known as a Zipfian distribution. That is, the product of the rank of a word and its frequency is approximately constant. Thus, the second most common word will appear roughly half as many times as the most frequent word. This implies that the most common words will comprise a large fraction of the total occurrences of all words in a document. For instance, in the Wall Street Journal data collected as part of the treebank project described in an article by Marcus et al. entitled *Building a Large Annotated Corpus of English: The Penn Treebank*, Computational Linguistics, Vol. 19, No. 2, pp. 313–330 (1993), the first ten "words", which are ",", "the", ".", "of", "to", "a", "and", "in", "'s", "is" and "that" account for slightly more than 25 percent of all of the words in the corpus. The 100 most frequent words alone account for 48.1 percent of all words in the corpus, while the 500 most frequent words account for 63.6 percent. This means that the remaining 80901 words account for the remaining 37.4 percent of all words in the corpus. Thus, the average word found in the top five hundred words is approximately 275 times more frequent than the average word not found in the top five hundred words.

It is thus desired to modify the Lempel-Ziv text compression techniques described in the prior art to take advantage of this observation so as to allow further compression of large documents as well as significant compression of smaller documents.

SUMMARY OF THE INVENTION

The present invention expands upon the Lempel-Ziv text compression techniques of the prior art. In particular, the present invention provides a compression dictionary and/or a compression window which contains some of the statistically significant words which will almost certainly allow compression to be achieved earlier into a document than if the compression software were required to relearn the list of extremely common words, letter sequences and phrases in the document to be compressed. For example, when using compression techniques based on LZ78, in which entries are added to the compression dictionary by extending previous entries by a single character, the invention makes it unnecessary to take several repetitions of even extremely frequent words before they are entered into the compression dictionary. This also means that the compression dictionary used in accordance with the invention does not necessarily contain prefixes of the long, frequent words that are initially present in the dictionary, unless such prefixes are themselves frequent. Rare prefixes aid the compression process little, and their main contribution in LZ78 is to allow a longer word to enter the compression dictionary, a step which is unnecessary when using the techniques of the invention, where the longer, frequent word is in the dictionary at the outset. Omitting the rare prefixes from the dictionary leaves room for other, more useful phrases.

While most extremely frequent words are short, the present inventors recognize that knowledge of the type of text being compressed can lead to larger benefit from a pre-filled dictionary. If, for instance, scientific text is being compressed, then samples of similar texts can be used to get a profile of the type of text being compressed. In scientific texts, some long phrases may be extremely common. These phrases would be learned by the compression software and would be used when the first reference to them was made in the data being compressed. So, if, for instance, a length 10 word or phrase were common, then even the first occurrence of that word could be encoded using a single dictionary reference, whereas under conventional LZ78, such an encoding might not be possible until as late as the eleventh occurrence of the word. The dictionary will also be prevented from containing substrings of this frequent word or phrase as would be the case in LZ78 unless such substrings are independently added during the compression process because they are useful outside the context of the frequent word or phrase.

When compressing text which is in a computer programming language, the present inventors have recognized that there is potentially even more to gain at the outset of compression. The programming language C, for instance, has a small number of words which represent constructs in the language. While the user can add to the list of these frequently occurring words by creating variables and functions, all C programs will make use of a subset of this basic set of words. As a result, having these words in the dictionary prior to the start of compression will result in better compression, especially for small files.

Thus, in order to take advantage of the frequency distribution of words in human languages and other sorts of data as well, the present inventors propose modifying standard Lempel-Ziv compression algorithms to incorporate a dictionary pre-filled with statistically important words and the entire alphabet over which compression is taking place. The process of filling the dictionary with words that are significant is handled in any of a number of ways. One possibility is for a user of the compression software to create a list of frequently used words. Since this process is objectionable in most circumstances, automatic processes are preferably used in accordance with the invention. However, additional pre-filled compression dictionaries may be created by the user of the compression software as desired.

On the other hand, several pre-filled compression dictionaries may be automatically tested at the start of the compression process on a small subset of the entire document to be compressed, and the dictionary that achieves the highest compression on this subset is chosen for compressing the entire document. Of course, the user may also select a particular compression dictionary as desired. Preferably, the identity of the pre-filled dictionary being used for the compression is stored in the compressed data so that the decompression software can identify which pre-filled dictionary to use during decompression.

The same pre-filled dictionary must be available to both the compressing device at compression time, and to the decompressing device at decompression time. It is possible to transmit such dictionaries from one device to another over a communications network, as necessary, to make the appropriate dictionaries available. For example, a plurality of pre-filled data compression dictionaries may be stored on communicating servers so that any text shared among the servers may be compressed/decompressed using the techniques of the invention. Also, the pre-filled data compression dictionaries are preferably created for different genres of text data and stored hierarchically so that the optimum pre-filled data compression dictionary may be selected for the data to be transmitted. In order to save memory space, any common entries among the plurality of pre-filled data compression dictionaries need only be stored once on each server. On the other hand, a pre-filled data compression dictionary used to compress a particular document may be the data specific dictionary formed during the compression of another, related text. In this manner, the compression of a plurality of documents may be iterative and based on a single original pre-filled data compression dictionary.

As will become apparent to those skilled in the art, the techniques of the invention may be used in connection with any of the known variants of the Lempel-Ziv compression algorithms.

BRIEF DESCRIPTION OF THE DRAWINGS

The above and other objects and advantages of the invention will become more apparent and will be more readily appreciated from the following detailed description of the presently preferred exemplary embodiments of the invention taken in conjunction with the accompanying drawings, of which:

FIGS. 1(A) and 1(B) together provide an example of prior art LZ77 text compression.

FIG. 2 is an example of prior art LZ78 text compression.

FIG. 3 is an example of prior art LZMW text compression.

FIG. 13 is a flowchart illustrating a hybrid LZ77/LZ78 decompression technique in accordance with the invention.

FIG. 14 is an example of text compression using a combination of the hybrid LZ77/LZ78 techniques in accordance with the invention.

DETAILED DESCRIPTION OF THE PRESENTLY PREFERRED EMBODIMENTS

The present invention will be described in detail below with respect to FIGS. 4–14. Those skilled in the art will appreciate that the description given herein is for explanatory purposes only and is not intended to limit the scope of the invention. Accordingly, the scope of the invention is only to be limited by the scope of the appended claims.

Figure 4:
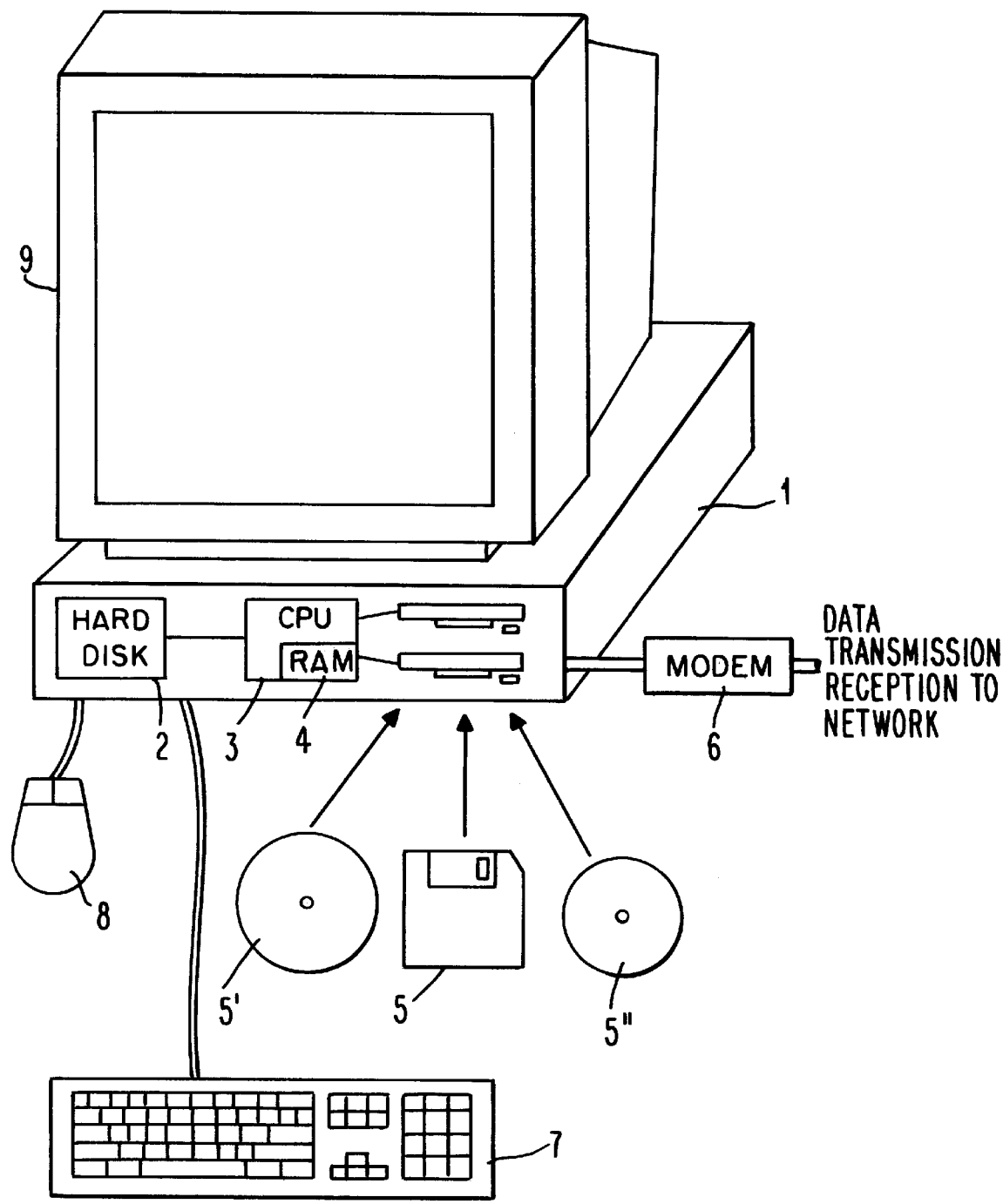
FIG. 4 illustrates a sample hardware configuration for implementing the modified Lempel-Ziv compression technique in accordance with the invention.

The extension to the Lempel-Ziv algorithms in accordance with the invention can be used in conjunction with all of the known variants of the Lempel-Ziv compression techniques described in the patent literature as well as in the text compression literature. However, in presently preferred embodiments, the present invention is used as a modification to the LZ77 or LZ78 compression techniques or as a modification to a Lempel-Ziv variant which is itself a modification to or extension of the LZ77 or LZ78 techniques. The extension to the Lempel-Ziv algorithms in accordance with the invention is preferably implemented as part of a software compression package or as a module which is used in conjunction with pre-existing software packages which would benefit from data compression, such as a commercial word processing package. A sample system configuration is shown in FIG. 4.

The present invention is preferably implemented as software containing instructions for controlling a processor of a user's computer 1. In a preferred embodiment, the executable version of the software implementing the Lempel-Ziv compression algorithm is stored on a fixed program storage device such as a hard disk 2 which is readable by a processor (CPU) 3 of computer 1 whereby the program of instructions stored thereon for implementing the Lempel-Ziv compression algorithm is executable by the processor 3 to perform the desired data compression. As shown in FIG. 4, CPU 3 includes a RAM 4 for storing the data during execution of the Lempel-Ziv compression algorithm. In a preferred embodiment, the data to be compressed is provided in digital form on a computer readable medium such as a floppy disk 5, an optical disk 5', or a CD ROM 5", or is received via a modem 6 and loaded into RAM 4. Of course, the data may be stored on the computer's hard disk 2 prior to being loaded into RAM 4 or may be provided directly via a network connection. Data input into the computer 1 from the user is provided via keyboard 7 and/or a mouse 8, and any accompanying graphics images are displayed on a computer video display 9.

In accordance with the invention, the pre-filled compression dictionaries are stored on the hard disk 2 along with the executable version of the software implementing the Lempel-Ziv compression algorithm and are loaded into the RAM 4 of CPU 3 during the execution of the Lempel-Ziv data compression algorithm. The data to be compressed may be stored as files on the hard disk prior to being compressed and then restored locally or transmitted after compression. In other words, if the data compression is being performed strictly to save local storage space, the results of the compression process are written to the hard disk 2 or other local memory. Alternatively, the input data and the pre-filled compression dictionaries may be provided on a computer readable medium such as a floppy disk 5, an optical disk 5', a CD ROM 5", received via modem 6, or provided directly via a network connection. On the other hand, if the data compression is being performed to allow faster data transmission across a point to point connection (e.g., via modem 6), then the CPU 2 is connected to the modem 6 or some other transmission device, and the compressed data is transmitted via that transmission device. In addition, the compressed data may be returned to the original computer readable medium (e.g., floppy disk 5, optical disk 5', or CD ROM 5").

Accordingly, during operation of the compression algorithm in accordance with the invention, RAM 4 typically receives the executable code, one or more pre-filled compression dictionaries, and the input data from hard disk 2, some other memory element such as a floppy disk 5, optical disk 5', or CD ROM 5", or via a modem connection, and the compressed data is either restored on the hard disk 2 or some other memory element such as floppy disk 5, optical disk 5', or CD ROM 5", or is transmitted via modem 6 to another computer for storage and/or decompression. In addition, when used with LZ78 algorithm variants, RAM 4 will preferably allocate space for a data specific dictionary of the type conventionally developed during operation of the LZ78 algorithm and its variants.

Figure 5:
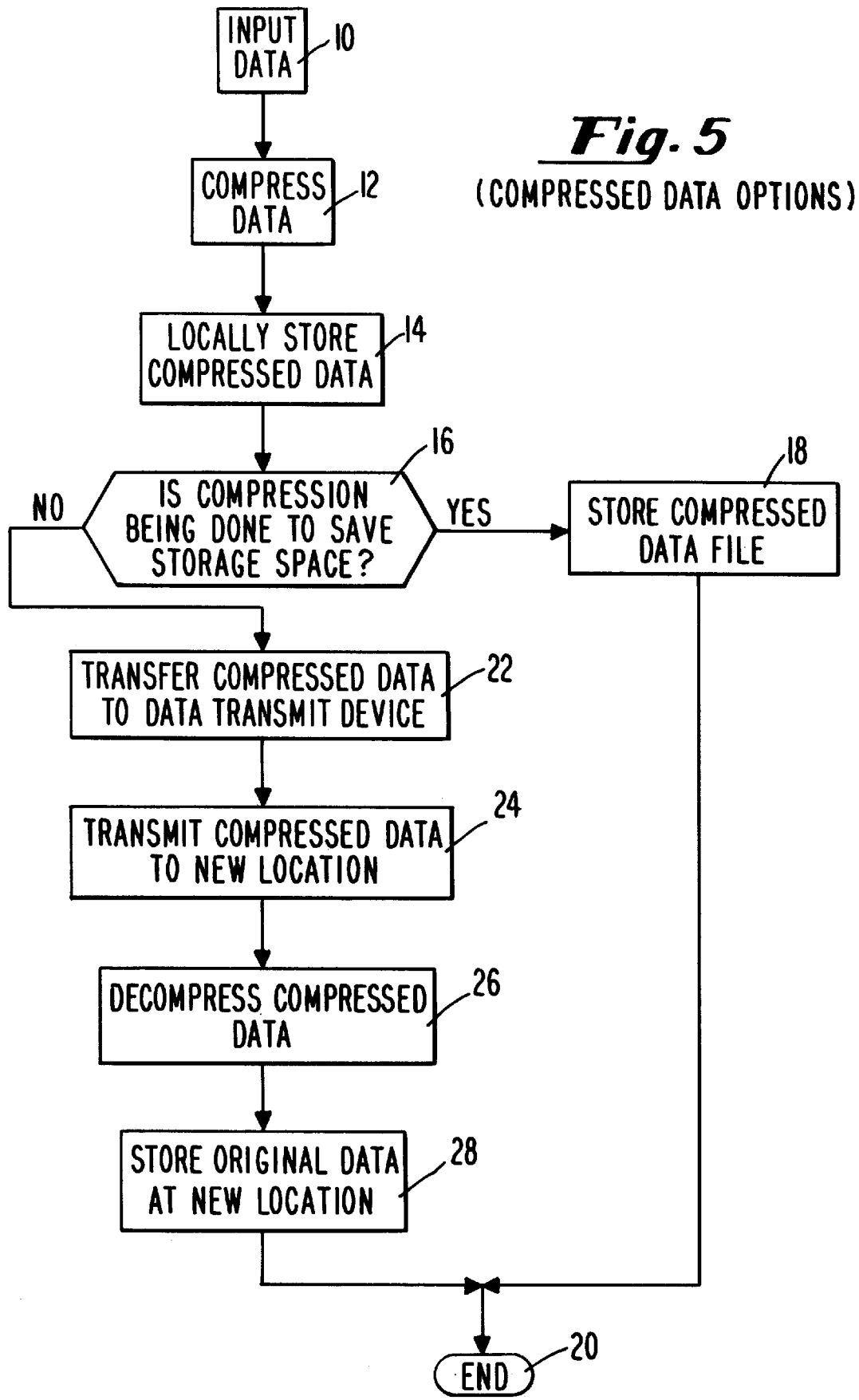
FIG. 5 illustrates the options for the use of the compressed data generated in accordance with the invention.

FIG. 5 illustrates the options for the use of the compressed data generated in accordance with the invention. As shown in FIG. 5, the input data to be compressed is input at step 10, compressed at step 12 using the preferred Lempel-Ziv compression algorithm variant, and the compressed data is temporarily stored at step 14. If it is determined at step 16 that the compression is being performed to save local storage space on the hard disk 2, CD ROM 5", and the like, the compressed data file is locally stored at step 18, and the routine is exited at step 20. However, if the input data is being compressed to speed up transmission to another computer, the compressed data is transferred at step 22 to a data transfer device such as modem 6 and transmitted to a new location at step 24. The transmitted compressed data is then decompressed at step 26 and stored in its original, decompressed form at step 28. The routine is then exited at step 20. As will be described below, it may be necessary to transmit the pre-filled compression dictionary with the compressed data or at least to identify the pre-filled compression dictionary used for the compression so that the same pre-filled compression dictionary may be used at the receiver during step 26 to decompress the compressed data. Of course, the received compressed data need not be decompressed immediately, but may be stored in its compressed form at the receiver until it is needed.

The process of pre-filling a compression dictionary with words that are significant to the Lempel-Ziv algorithm is handled in any of a number of ways in accordance with the invention. One possibility is for a user of the compression software to create a list of frequently used words. Since this process is objectionable in most circumstances, automatic processes are preferably used in accordance with the invention. As in U.S. Pat. No. 4,386,416, one possibility for such an automatic process is to restrict the pre-filled compression dictionary to what are normally referred to as words-that is, sequences of characters which are delimited by either spaces, tabs or punctuation marks. However, it is preferred that statistics be collected from a representative sample of text to determine the most frequent sequences of characters of various lengths. The number of dictionary entries of each length can be determined by a function of the amount of compression which will result from the use of a particular length entry (that is, the number of bits originally required to encode a string of the particular length less the number of bits required to transmit a reference to a dictionary entry, which will not vary with the length of the dictionary entry, but rather will be a fixed quantity determined from the size of the dictionary) and the observed frequency of that sequence within the sample of text utilized.

For example, assuming a dictionary reference when performing compression costs 12 bits (that is, the dictionary contains at most $2^{12}$ or 4096 entries) and also assuming a 7 bit encoding of the ASCII character set, a sequence of 10 characters would require 70 bits of storage space without compression, while a sequence of 9 characters would require 63 bits of storage space without compression. If in the sample of text from which frequency statistics were derived a particular length 10 sequence occurred 60 times, then the savings that would result, if that sequence were in the dictionary, would be 60*70=4200 (the cost of transmitting the raw data) less 60*12 =720 (the cost of transmitting the pointers) which is 3480 bits of savings. Assuming the length 9 string was more frequent and occurred 65 times, the cost savings associated with having that length 9 sequence in the dictionary would be (65*63)-(65*12)=3315 bits of savings. Thus, the length 10 sequence would be preferred as a dictionary entry over the length 9 sequence.

The contents of the pre-filled dictionary may be efficiently selected as follows. The text of all of the documents from which the pre-filled dictionary will be learned should be loaded into a data structure which allows all of the subsequences of the text to be identified easily. Generally, a maximum length will need to be chosen for the strings in the dictionary to prevent the cost of the computation from getting too high. A length of 10 or 15 characters would probably suffice, but an appropriate maximum length may be determined experimentally, if desired. However, since there is not a particular maximum length specified in the design of the algorithm of the invention, the choice of a maximum length is left to the user of the dictionary building software. As a result, the chosen maximum length may not result in optimal compression. This is because there is a trade-off between compression and the cost of generating the pre-filled dictionary, and the user of the dictionary building software must choose a maximum length which will allow the pre-filled dictionary to be built in a reasonable amount of time on his or her computer.

A tree data structure in which each node contains a one character string and a count will be used to identify frequently occurring strings. The root of this tree contains the empty string and the total number of characters in the corpus. Each daughter node will extend the string created by concatenating all of the characters contained by nodes on the path from the root of the tree to the current node. In this way, all of the character sequences up to a particular length can be stored in a tree no deeper than the chosen maximum length. This tree could grow to be very large, with the leaves of the tree numbering the size of the alphabet raised to the power of the depth of the tree. However, because of the sparsity of data, the tree should in practice be much smaller. As will be appreciated by those skilled in the art, the data is sparse as a result of the properties of human language whereby the languages do not contain, or at least do not frequently contain, all of the possible n-grams. For example, the letter sequence "zqwxv" is extraordinarily rare and unlikely to appear in the training data if the data is in the English language.

Once the tree data structure has been filled, sequences which maximize the cost savings formula outlined above will be identified. Overlapping strings are handled since all subsequences of an identified sequence need to have their count in the tree data structure updated by subtracting the number of occurrences of the sequence chosen to enter into the dictionary. This may be illustrated by an example. Suppose a sequence "ABC" which occurs 10 times in the data is chosen as a dictionary entry. The count associated with the node for "AB" in the tree would then be decremented by 10, as would the count for "BC", the count for "A", the count for "B", and the count for "C". Even the node associated with the sequence "ABC" itself would be decremented by 10, thus eliminating it from the tree and from future consideration as a dictionary entry.

Figure 6:
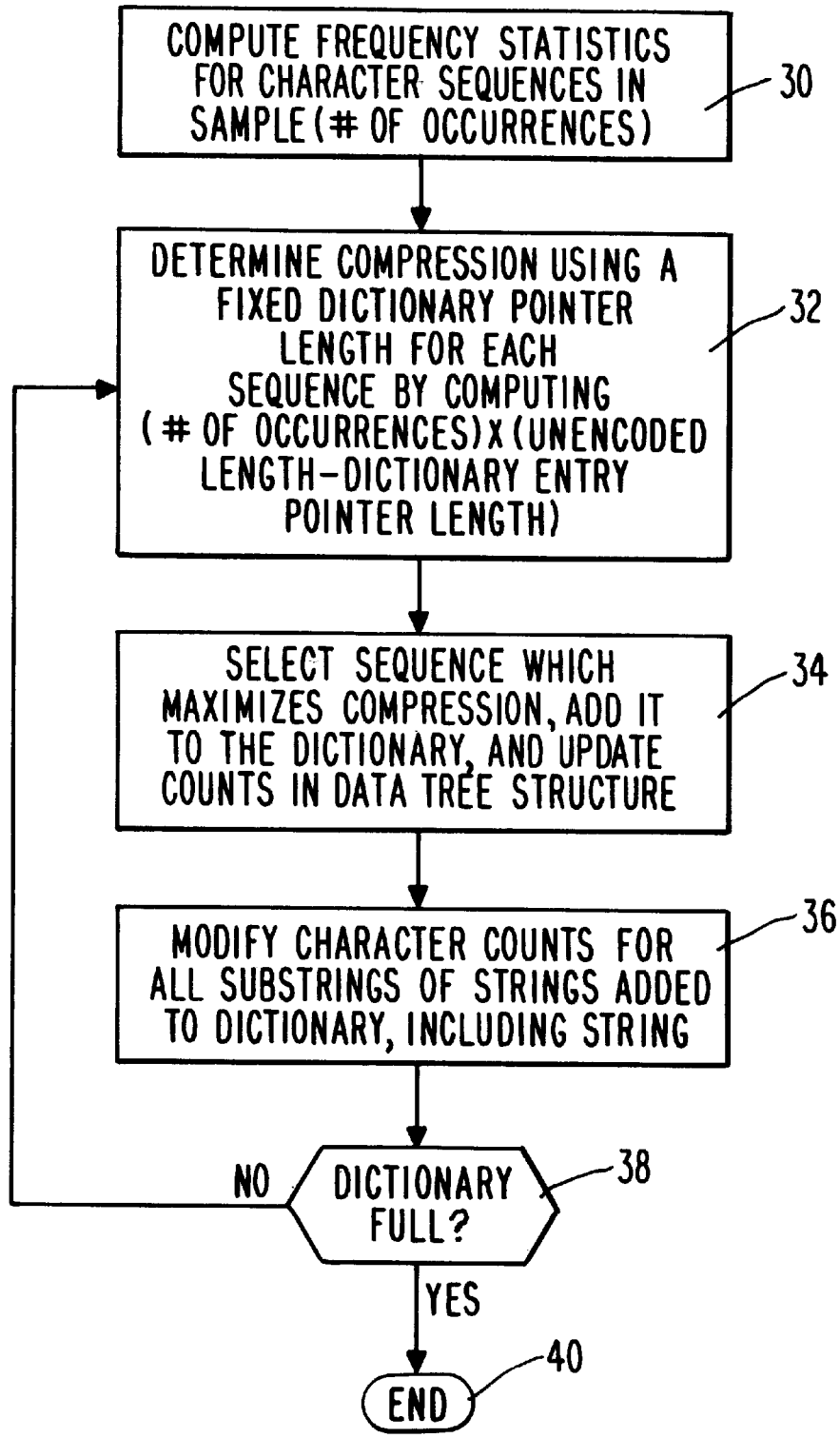
FIG. 6 illustrates a flowchart of the dictionary creation process in accordance with the invention, whereby the sequence selected for entry into the dictionary is the sequence which maximizes compression.

FIG. 6 illustrates a flowchart of the dictionary creation process in accordance with a preferred embodiment of the invention, whereby the sequence selected for entry into the dictionary is the sequence which maximizes compression. As illustrated in FIG. 6, the pre-filled compression dictionary is created from a text sample by computing the number of occurrences (frequency statistics) of particular character sequences in the sample at step 30 and then determining at step 32 the compression for each character sequence given a fixed dictionary size, and therefore, a fixed dictionary entry pointer length. The text sample may be a portion of the text to be compressed, a similar document, or a collection of similar documents of the same genre. As in the above example, the compression is computed as: the number of occurrences of a particular sequence as determined in step 30 multiplied by the difference between the unencoded length of that particular sequence and the dictionary entry pointer length. The resulting compression for each character sequence is then used to determine which sequences maximize the compression. The character sequence which maximizes compression is selected and added to the compression dictionary at step 34. As necessary, the counts in the data tree structure are updated as described above. The character counts for all substrings of the character sequence which was just added to the compression dictionary at step 34, including the character count for the character sequence itself, are then modified at step 36. By so modifying the character count of the string itself, later inclusion of that same string in the compression dictionary is prevented. If it is determined at step 38 that the compression dictionary is not full, the process of selecting those sequences which yield the most compression continues until it is determined at step 38 that the compression dictionary is filled with those sequences which yield the most compression. The routine then ends at step 40. Of course, a compression dictionary formed in this manner will generally contain short sequences which occur very frequently as well as those longer sequences which occur frequently enough to lead to substantial compression.

The address space for the dictionaries preferably will be shared, thus no flag indicating which dictionary is being used need explicitly be sent. The address space can be divided between the pre-filled dictionary and the conventional data specific or adaptive dictionary in any way seen fit by the builder of the compression dictionary. Also, the overall size of the combined compression dictionary can be determined by the builder of the compression dictionary. However, the size should be an even power of 2, since the dictionary entry numbers themselves will be encoded in a binary representation.

Those skilled in the art will appreciate that a large representative sample of uncompressed text may include documents that fall naturally into different genres of text, each with its own terminology and statistical properties. The documents of a given genre thus constitute a smaller text sample specific to that genre. Each such sample may be used to create a separate pre-filled compression dictionary tailored to its genre. Thus, any combination of the above techniques or other techniques for deriving a compression dictionary can be applied to several different types, or genres, of data such as English text, French text, computer programs written in C, computer programs written in Pascal, database files, images, and the like. Once the most frequent "words" for each type of data are discovered, a dictionary for each type of data can be created. This dictionary, in conjunction with an initially empty dictionary, to which new "words" will be added, will then be used to perform Lempel-Ziv compression using conventional techniques. For example, if English newspaper text were being compressed, the dictionary would be pre-filled with the most frequent English letter sequences, words and/or phrases found in a sample of newspaper articles.

In order to compress a document of a particular genre, the compressing computer first identifies the genre to which the document is most similar by automatic means (e.g., based on key words or clustering methods) and selects the pre-filled compression dictionary appropriate to that genre. Information identifying the selected pre-filled compression dictionary is then appended to the compressed data file. At decompression time, the decompressing computer examines the appended information in order to determine which pre-filled dictionary to use when decompressing the received data.

For this method to work as desired, the collection of sample documents must initially be partitioned into multiple genres. This may be done by any one of several methods. For example, a human or humans may decide the partition manually based on subjective or objective criteria. Alternatively, a computer may automatically scan each document for words or statistical orthographic patterns that indicate membership in a particular genre, such as the genres of "Spanish text" or "compiled computer programs." In addition, if nothing is known about the collection of sample documents, the collection may be automatically partitioned into a reasonable set of genres by using data clustering methods well known in the literature.

Thus, additional pre-filled dictionaries can be created by the user of the compression software as desired. If the user routinely compresses data which has a standard vocabulary of its own, such as computer manuals or business documents, both of which make frequent use of words not commonly found in other forms of text, he or she can apply the dictionary creation process to a large body of this type of text and create a customized dictionary for use with these types of documents. Obviously, for decompression to be possible, the software performing the decompression must also have access to this dictionary. Similarly, if the data is not being compressed for archival purposes, but is being compressed for on-line transmission, the recipient of the compressed data must have access to this custom-made dictionary. Thus, the dictionary creation process should not be undertaken frequently, as it would require distribution and storage of a large number of dictionaries and would eliminate or, at least, reduce the added benefit of using a more appropriate dictionary for compression purposes.

During the compression process, the pre-filled dictionary which is likely to achieve the highest level of compression can be determined by performing compression on a small subset of the entire document to be compressed using each of the pre-filled dictionaries. In other words, the first N characters of data of the text to be compressed (N is arbitrary and may be chosen in advance or computed as a percentage of the document length, subject to a maximum so that identifying the dictionary does not consume too much time) are compressed using each of the putative pre-filled dictionaries. The compression using each pre-filled dictionary is computed, and the pre-filled dictionary which maximized compression is selected for compressing the entire text. In this way, the most appropriate dictionary can be used for the particular text to be compressed. In addition, the user can choose a dictionary manually if he or she is aware that the document being compressed is typical of the class of documents represented by a particular pre-filled dictionary. This would prevent the software from experimenting with various compression dictionaries and result in a time savings during the compression process. Additionally, manual selection may be necessary to allow the transmission of a document to another user who does not possess all of the pre-filled dictionaries the sender possesses or in the event of compression for archival purposes, so that the document may be decompressed at a later time by software not cognizant of all of the available compression dictionaries, such as software at a remote site.

In addition, if it is determined during the compression of the subset of characters in the data to be compressed that starting with a completely empty data compression dictionary would allow for the most compression, then the pre-filled data compression dictionary may be eliminated from the encoding of that particular data.

During the decompression process, the same modifications to the data-specific dictionary are made which were made to the data-specific dictionary built during compression. In this way, references to the data-specific dictionary within the compressed data may be expanded properly into the reconstituted text created by the data decompression system. The identity of the pre-filled dictionary being used for compression is preferably stored in the compressed data so that the decompression module is able to identify which pre-filled dictionary to use during decompression. Similarly, an indication of which variant of the Lempel-Ziv algorithm used to perform the data compression may also be stored with the compressed data as well as an indication of which policy was used during compression to flush the entries in the two dictionaries. In addition, an indication of how the dictionary address space is allocated to the dictionaries involved in compression may be stored within the compressed data—that is, what the starting and ending addresses are for the data specific dictionary as well as the starting and ending addresses for the one or more pre-filled dictionaries used in the compression. Also, if the compressed data is transmitted to a remote site, it may be necessary to send the compression dictionary in order to permit decompression at the remote site. However, this may defeat the purpose of compression unless the time savings is greater than the time needed to transmit the dictionary. On the other hand, even if the time savings does not exceed the cost of transmitting the dictionary, it might be wise to transmit the dictionary if other documents compressed using this dictionary are likely to be transmitted. Accordingly, when the compressed data is to be transmitted to a remote site, it is generally desirable to use only pre-filled compression dictionaries which are available at the recipient site.

However, if the sender determines that the optimal pre-filled dictionary is dictionary A, but compresses with dictionary B instead because the receiver does not have dictionary A, then the sender could also transmit a message to the receiver suggesting that the receiver obtain dictionary A for future use. Once the receiver gets enough such messages, the receiver will eventually request a copy of dictionary A from the sender or another server on which dictionary A is available. The receiver then places the copy of dictionary A in local long-term or medium-term storage.

As another option, the sender may compress the data file using pre-filled dictionary A, without consideration of whether the receiver has dictionary A. Then, whenever the receiver decompresses the file for the first time, it will need a copy of dictionary A. If dictionary A is not currently stored at the receiver, the receiver will obtain a copy via the network. The receiver then places a copy of dictionary A in long-term or medium-term storage, for future use, in addition to using it to decompress the file.

On the other hand, it may happen that one may desire to compress a large collection of documents at once, e.g., for archival purposes. Rather than compress the documents separately, it is desirable to exploit the similarities among the various documents, not just the similarities within each document or its similarity to a preselected corpus. In other words, if some of the documents are related to each other in some manner, many of them will contain similar strings which can be exploited to provide more compression.

For example, suppose that document A were compressed in accordance with the invention using a dictionary D pre-filled with common English language words. At the end of the compression of document A, an extended dictionary D' remains that contains entries from D as well as strings that appeared in document A. Another document B may now be compressed using the dictionary D' instead of the pre-filled dictionary D (or some compromise between dictionary D and dictionary D') as the starting dictionary. If document B is quite similar to document A, this technique has been found to provide superior compression.

However, in the general case in which it is desired to compress a large number of documents, any compressed document B ought to specify the starting dictionary to use when decompressing. It may specify one of the stock pre-filled dictionaries, or it may name another compressed document, document A, and specify that the final dictionary resulting from the decompression of document A be used as the starting dictionary for the decompression of document B.

Clustering techniques may be used to determine which documents are dependent on the final dictionaries of other documents. Documents determined through clustering to be very similar to each other are compressed using one another's compression dictionaries. The information about which documents depend on one another is specified in the header of the document when it is compressed so that the decompression software can correctly decompress the document once all of the documents on which it depends are themselves decompressed.

Thus, in general, the compression rates for certain data can be improved by having a great many compression dictionaries available, each tailored for a highly specific type of text. However, there is a cost associated with storing, and sometimes transmitting, so many dictionaries. This cost can be minimized by recognizing that the different dictionaries code many of the same strings and hence overlap in content to a substantial degree. This characteristic of the dictionary coding can be taken advantage of so that pre-filled dictionaries for a plurality of genre-specific text samples can be created simultaneously from a single large corpus of documents. In this example, a special combined representation for the multiple dictionaries would be created which would take up less space than that necessary to store all of the different genre-specific dictionaries separately. In short, memory space is saved by storing a string which appears in multiple dictionaries only once rather than separately storing the entry in each respective dictionary.

Those skilled in the art will appreciate that, to a certain degree, the invention trades off compression efficiency with dictionary compactness. To illustrate this, a parameter can be defined which indicates the relative importance of compression efficiency and dictionary compactness. When the parameter is set to 1, maximum compression efficiency is obtained. In other words, when the parameter is 1, a specialized dictionary is independently built for each genre and the dictionaries for each genre are only combined to eliminate the redundant storage of duplicates as described above. On the other hand, if the parameter is reduced somewhat, then the genre dictionaries are not built wholly independently; they are deliberately constructed to improve their overlap. If the parameter is reduced all the way to 0, then maximum overlap is obtained by using the same dictionary for every genre. The parameter setting of 0 thus produces the smallest combined dictionary, but it does not take advantage of the genre-specific properties at all. At present, the inventors believe that the technique of the invention will work best when the many specialized genres have been grouped together two or three at a time into hierarchical "super-genres" analogous to the "Dewey Decimal" classification system for sample documents. Such hierarchical classification techniques may be accomplished, if necessary, by well known automatic clustering methods.

A preferred embodiment of the invention now will be described with respect to FIGS. 7–11 as an extension of LZ78. In the LZ78 algorithm of the preferred embodiment, text is compressed, as was shown in FIG. 2, using a compression dictionary which is expanded during the compression process whereby references to the compression dictionary are transmitted in place of the original text. Unlike conventional LZ78, however, the compression dictionary used in accordance with the invention does not start with only the empty string. Instead, it is initialized to contain not only the empty string but also the contents of a pre-filled dictionary, or several pre-filled dictionaries, created in one of the manners described above. The pre-filled dictionary may also contain the entire contents of the alphabet over which compression is being performed. Also, the compression dictionary can either be regarded as two separate dictionaries which share a common address space or as a single larger dictionary, depending on the specifics of the embodiment of the technique. Thus, the technique used in accordance with the invention begins with a pre-filled dictionary, or several pre-filled dictionaries, as well as the conventional data-specific dictionary which contains only the empty string to which additional entries are added. However, if all the characters of the alphabet have been added to the pre-filled dictionary, as in LZMW, then the data specific dictionary should be empty (since it is never necessary to transmit the empty string followed by its extension).

The pre-filled dictionary space may be regarded as two separate dictionaries sharing the same address space or as one or more independent pre-filled dictionaries which may or may not be concatenated to form one larger pre-filled dictionary prior to the start of compression. When a sequence of characters to be compressed is encountered, the longest match (LM) within either the pre-filled dictionary or dictionaries or the data specific dictionary is found in either a look-up table or using a tree data structure. Once this match is found, then a dictionary entry number and the character following this sequence is transmitted. Then, the concatenation of the just transmitted dictionary entry and the character transmitted is added to the data specific dictionary. This process repeats until the data to be compressed is exhausted.

As with LZ78, the pre-filled dictionary has a fixed size, which determines the size of the dictionary entry number which needs to be transmitted to effect compression. Once the pre-filled dictionary is filled, no further entries to it are allowed. However, any of the modifications to dictionary handling outlined in the literature may be used. For example, a least recently used algorithm could be used to discard dictionary entries when new entries need to be added. Alternately, performance could be monitored and the data specific dictionary could be reset when the compression ratio drops below a certain threshold or deviates from the compression ratio achieved for the preceding sections of the data being compressed.

Figure 7:
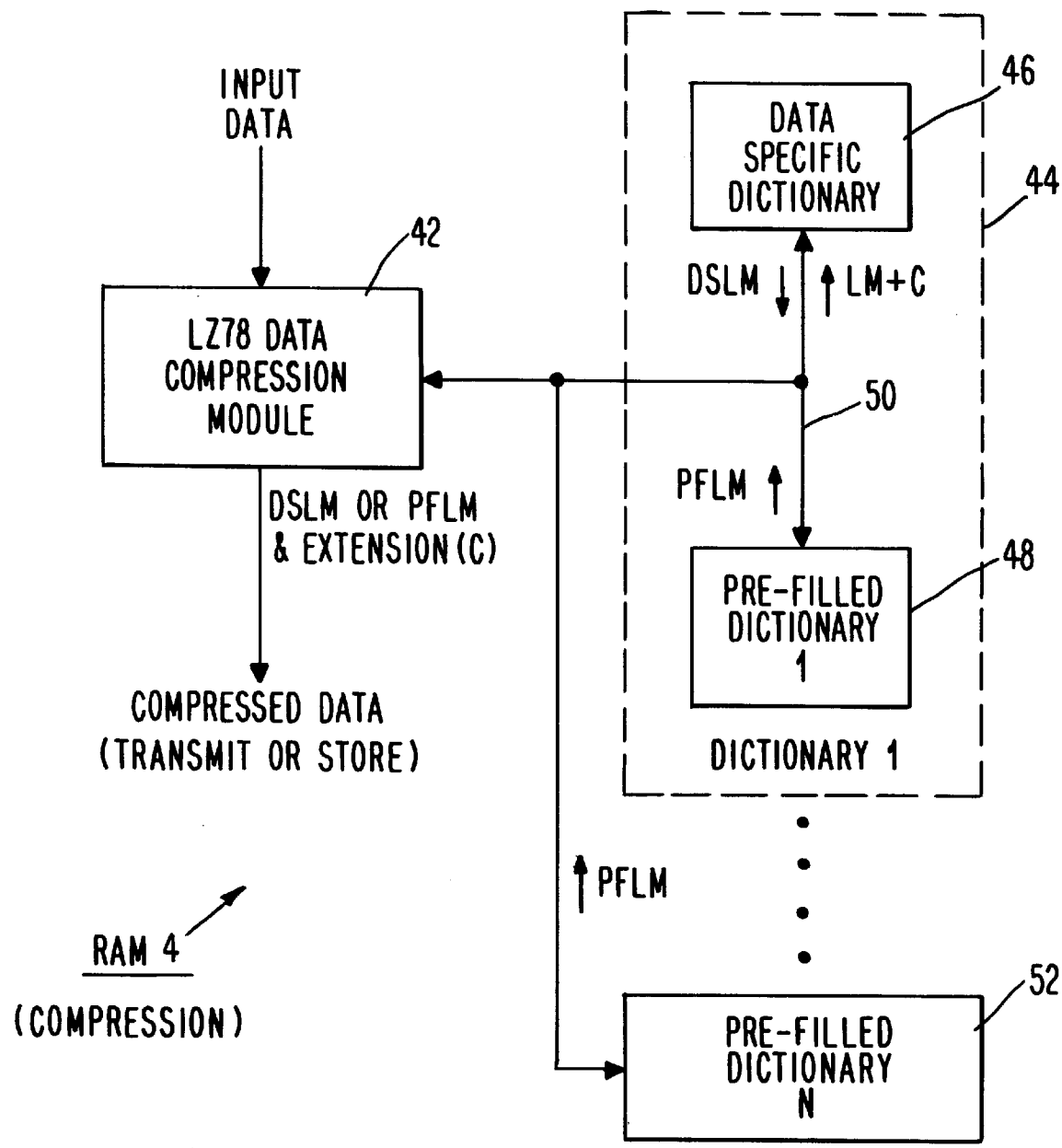
FIG. 7 illustrates a preferred embodiment of a LZ78 compression system which uses one or more pre-filled dictionaries in accordance with the techniques of the invention.
Figure 8:
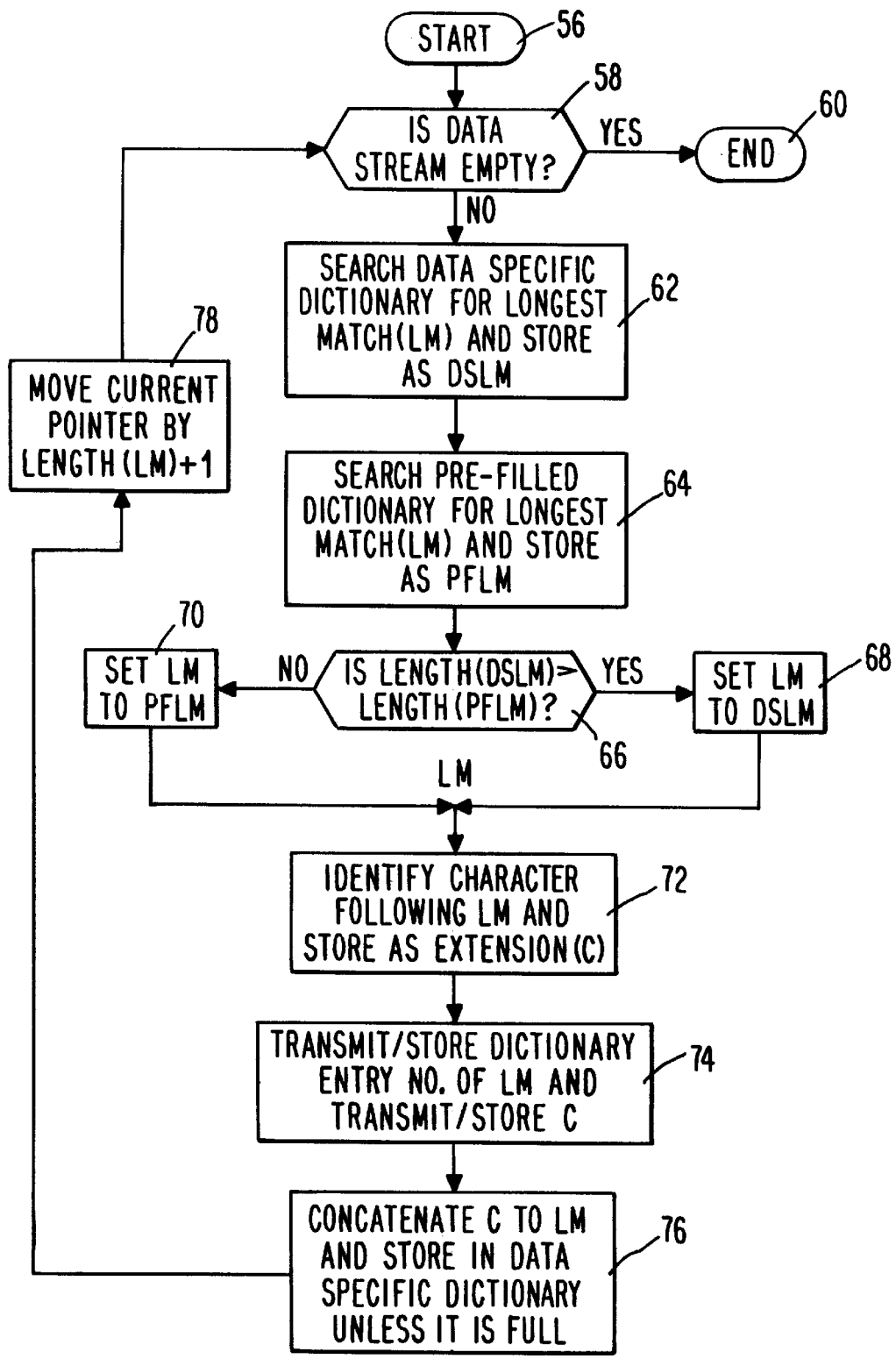
FIG. 8 is a flowchart illustrating a modified LZ78 compression technique in accordance with the invention.

FIGS. 7 and 8 illustrate a preferred embodiment for performing LZ78 data compression in accordance with the invention. As shown in FIG. 7, the input data to be compressed is provided to an LZ78 data compression software module 42, which may contain any of the known LZ78 algorithm variants. As noted above, the dictionary 44 can be regarded as containing two separate dictionaries—a conventional LZ78 data specific dictionary 46 and a pre-filled dictionary 48, respectively, both sharing the same common address bus 50. Also, a plurality of pre-filled dictionaries 52 may be used in order to find the pre-filled dictionary which provides the most compression for the particular input data. All of the active elements in FIG. 7 would typically be brought into RAM 4 for processing by CPU 3 (FIG. 4) during operation.

FIG. 8 is a flowchart of software for implementing the modified LZ78 compression technique in LZ78 data compression module 42 in accordance with the invention. As shown, the routine starts at step 56 by checking at step 58 whether the input data stream is empty. If it is empty, then all input data has been compressed and the routine exits at step 60. However, if the data stream is not empty, and hence there is more input data to compress, the data specific dictionary 46 is searched at step 62 for the longest match (LM) with the data sequence following the current pointer. The longest match found is stored in the LZ78 data compression module 42 as DSLM. The pre-filled dictionary 48 and/or pre-filled dictionaries 52 are then searched at step 64 for the longest match (LM) with the data sequence following the current pointer. The longest match found is stored in the LZ78 data compression module 42 as PFLM. At step 66, the CPU 3 then determines whether the length of the longest match found in the data specific dictionary 46 is longer than the length of the longest match found in the pre-filled dictionary 48 (and other pre-filled dictionaries 52 if more than one is used). If the length of DSLM is greater than the length of PFLM, then the longest match is set to DSLM at step 68; otherwise, the longest match is set to PFLM at step 70. (If the lengths of DSLM and PFLM are the same, then the same dictionary used for the previous input data sequence may be used, although it may be desirable to simply assign one of the dictionaries when the lengths are the same to avoid the need for a flag to keep track or which dictionary was last used.)

Once LM is determined in steps 66–70, the character following LM in the input data stream is identified at step 72 and stored as an extension (C) in the LZ78 data compression module 42. The dictionary entry number of LM (and which dictionary) is then transmitted/stored as desired at step 74. Similarly, the extension (C) is transmitted/stored as desired at step 74. Then, at step 76, the extension (C) is concatenated to the longest match (LM) and stored in the data specific dictionary 46 unless it is already full. Of course, prior art updating techniques may also be used to allow the latest entry to be inserted into the data specific dictionary 46 in place of, e.g., the least recently accessed entry. At step 78, the current pointer to the input data is then moved by the length of the longest match plus one (for the extension). Control then returns to step 58, and the compression process is repeated for the next sequence of input data until the data stream is exhausted and the compression process completed.

The method of FIG. 8 may be modified to take into account the cost savings associated with compressing a data sequence using the data-specific dictionary with LZ78 or the window in LZ77 or referring to the pre-filled dictionary. In LZ78, the cost of each approach will probably be identical, but when extending LZ77 to include pre-filled dictionaries in accordance with the invention, the cost of compressing using the two approaches may differ and it may be advantageous to chose one method over the other in the event that compression using both techniques is possible.

Decompression of a LZ78 compressed data sequence in accordance with the invention is performed in substantially the same way as with conventional LZ78 decompression techniques. All modifications to the compression dictionary made during compression are made during decompression as well. This limits the usefulness of the algorithm somewhat, as is the case with conventional LZ78, since decompressing a portion of data requires that the preceding portion be decompressed in its entirety. When performing decompression, the list of dictionary entry number and character pairs is processed one pair at a time until it is exhausted. Generally, each dictionary entry is looked up within the dictionary and the text which it refers to is displayed followed by the character in its dictionary entry and character pair. In this way, lossless compression/decompression is achieved.

Figure 9:
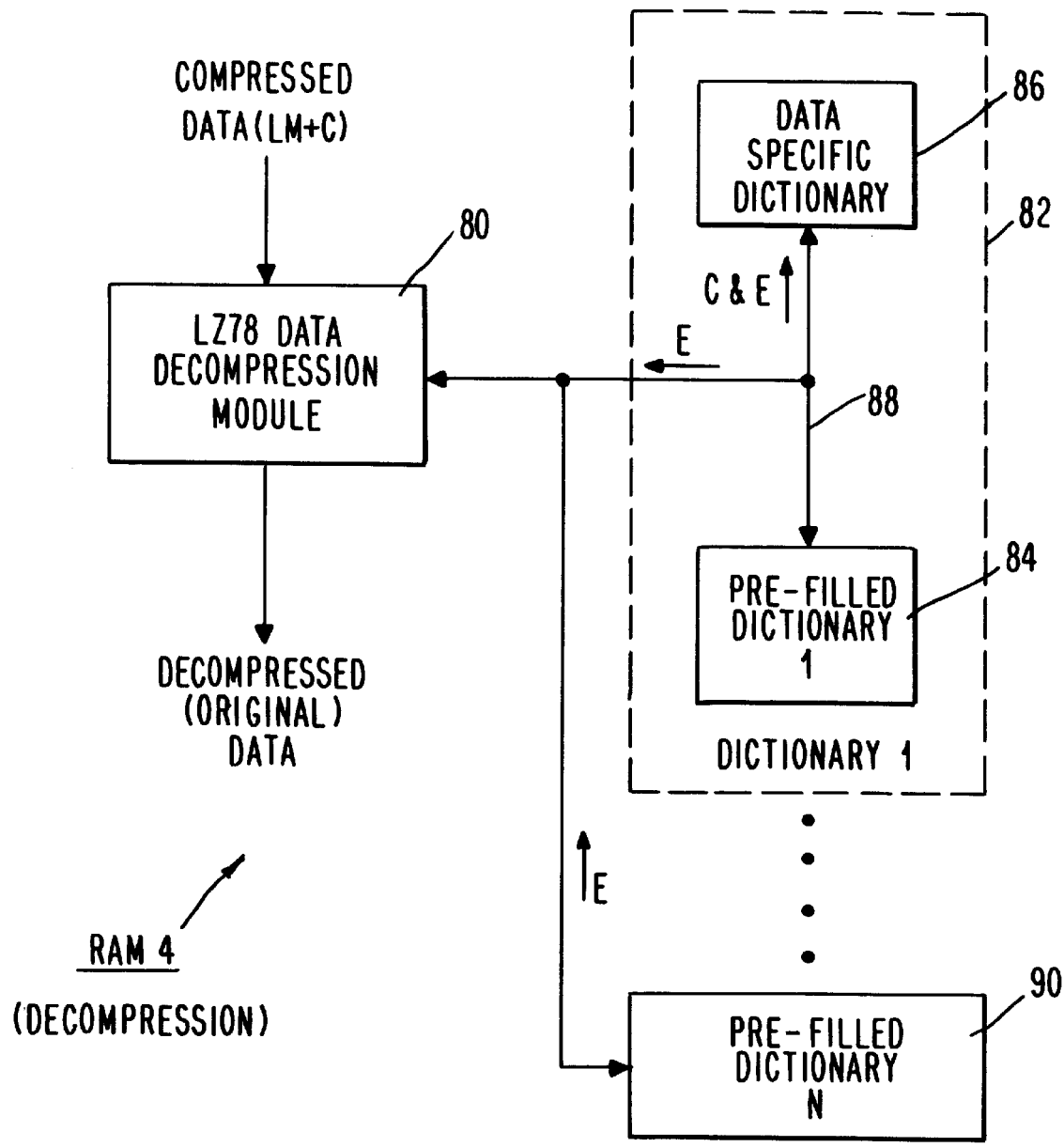
FIG. 9 illustrates a preferred embodiment of a LZ78 decompression system which uses one or more pre-filled dictionaries in accordance with the techniques of the invention.
Figure 10:
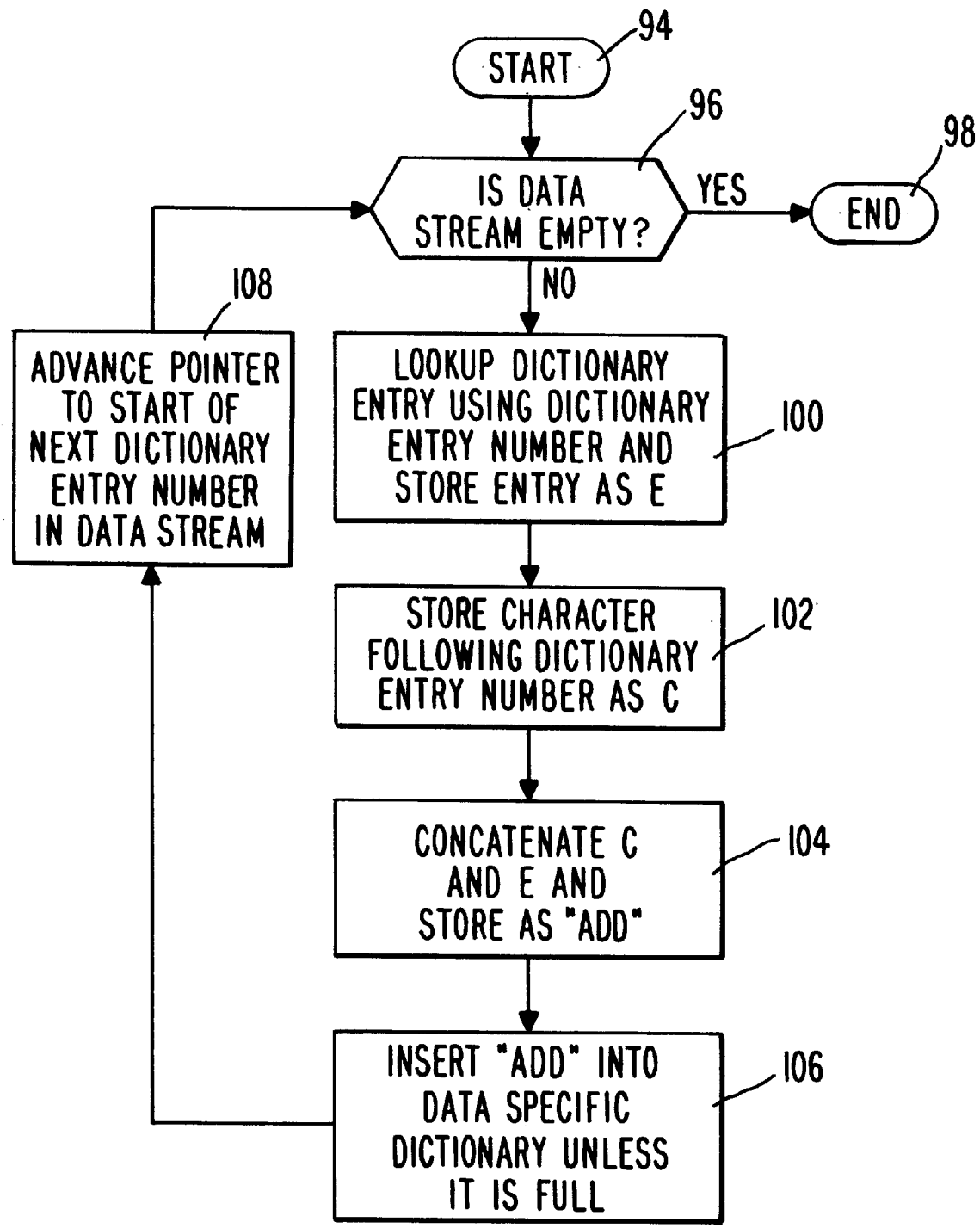
FIG. 10 is a flowchart illustrating a modified LZ78 decompression technique in accordance with the invention.

FIGS. 9 and 10 illustrate a preferred embodiment for performing LZ78 data decompression in accordance with the invention. As shown in FIG. 9, the compressed data is provided to an LZ78 data decompression software module 80, which may contain any of the known LZ78 algorithm variants. During operation, the LZ78 data decompression module 80 looks up the dictionary entry of the input compressed data in the dictionary 82, which includes pre-filled dictionary 84 and a conventional data specific dictionary 86, using the dictionary entry number which identifies the LM. The resulting dictionary entry is then stored in the LZ78 data decompression module 80 as the entry E. The character following the dictionary entry number in the input compressed data stream is then stored in the LZ78 data decompression module 80 as C. C and E are then concatenated by the CPU 3 and inserted into the data specific dictionary 86, unless it is full, and then output as the reconstituted, decompressed (original) data. The concatenated data is inserted into the data specific dictionary 86 using the same conventions for which the data was inserted into the data specific dictionary 48 during compression. In other words, the dictionary code assigned or reassigned to the concatenated data is determined in the same manner as the assigned dictionary code is determined during compression.

Those skilled in the art will appreciate that the dictionary entry number is assigned differently during decompression depending on the variation of compression used. If conventional Lempel-Ziv compression is used, then the dictionary entry number assigned will be the next one in sequence (i.e., the first one will be numbered 0, the next 1, the next 2, etc.). Since conventional Lempel-Ziv does not make any provision for performing any special functions on the dictionary, then the dictionary will either be reset and the dictionary numbers will revert to 0 when the dictionary is full, or the dictionary will not be allowed to grow further. On the other hand, if a more complicated scheme is used to manage the dictionary, like "least recently used" (LRU), then the dictionary entry number assigned will be the same as the one just described until the dictionary fills up. At that point in time, the LRU algorithm will come into play, and the dictionary entry number of the least recently used dictionary entry will be assigned. The dictionary entry previously associated with that dictionary entry number will be removed from the dictionary.

As with the pre-filled dictionary 48 on the compression side, the dictionary 82 can be regarded as two separate dictionaries sharing the same common address bus 88. Also, a plurality of pre-filled dictionaries 90 may be used during decompression if a plurality of such pre-filled dictionaries were used during compression. All of the active elements in FIG. 9 would typically be brought into RAM 4 for processing by CPU 3 (FIG. 4) during operation.

FIG. 10 is a flowchart of software for implementing the modified LZ78 decompression technique in accordance with the invention. As shown, the routine starts at step 94 by checking at step 96 whether the input compressed data stream is empty. If it is empty, then all input data has been decompressed and the routine exits at step 98. However, if the compressed data stream is not empty, and hence there is more input data to decompress, the dictionary entry corresponding to the current pointer is looked up at step 100 using the dictionary entry number. The corresponding dictionary entry so found is then stored in the LZ78 data decompression module 80 as E. If desired, the decompressed data is also displayed to the user. At step 102, the character in the input compressed data stream which follows the current dictionary entry number is then stored in the LZ78 data decompression module 80 as C. If desired, that character is also displayed to the user. At step 104, the character C and the dictionary entry E are concatenated and stored in the LZ78 data decompression module 80 as ADD. Once again, if desired, the resulting concatenation is also displayed to the user. Then, at step 106, the concatenation "ADD" is inserted into the data specific dictionary 84 unless it is already full. Of course, prior art updating techniques may also be used to allow the latest entry to be inserted into the data specific dictionary 80 in place of, e.g., the least recently accessed entry. Finally, at step 108, the current pointer to the input data is then advanced to the start of the next dictionary entry number in the input compressed data stream. Control then returns to step 96, and the decompression process is repeated for the next sequence of input data until the input compressed data stream is exhausted. The decompression process is then complete.

Figure 11:
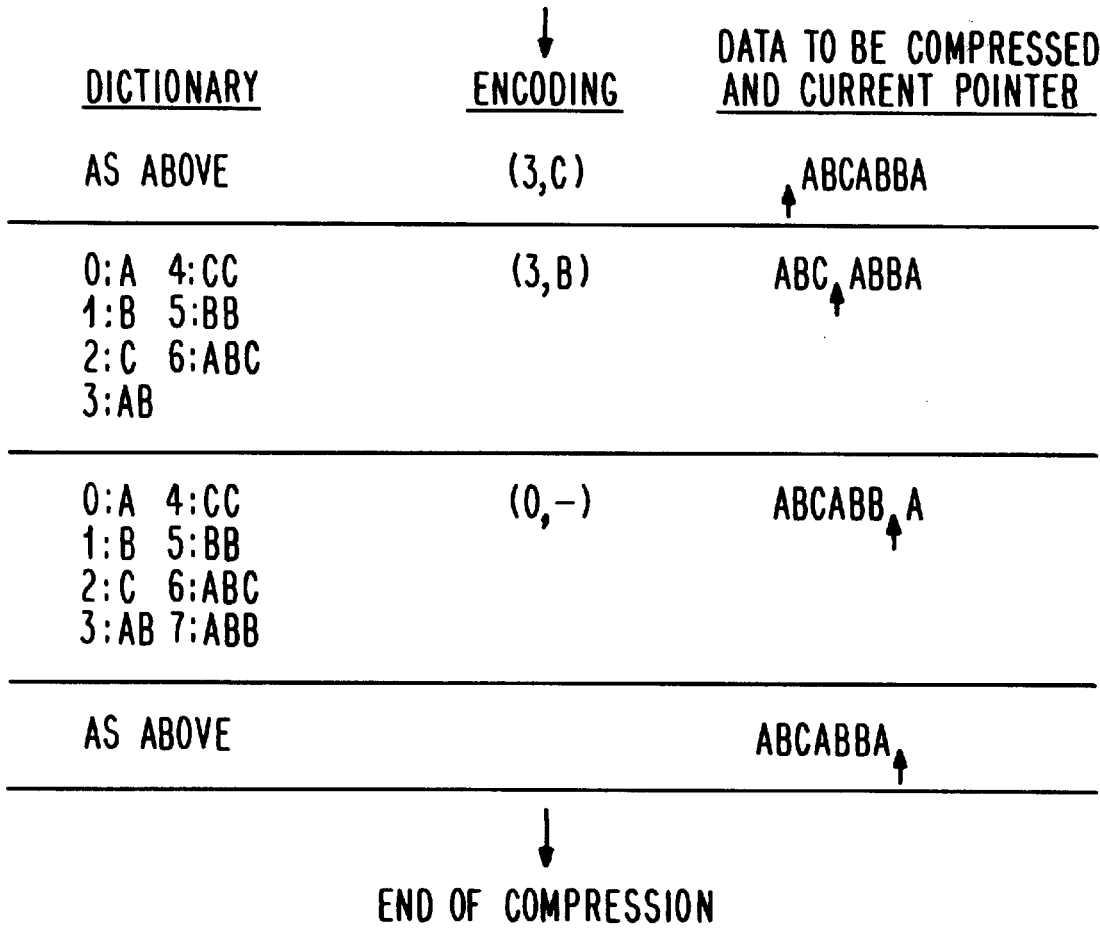
FIG. 11 is an example of text compression using the modified LZ78 technique of the invention.

FIG. 11 is an example of text compression using the LZ78 embodiment of the invention described with respect to FIGS. 7–10. As in the example of FIG. 2, the alphabet is assumed to contain only 3 characters (A,B,C) and the data to be compressed is the same as in FIG. 2 for purposes of illustration. As shown, the compression dictionary initially contains the characters of the alphabet as well as frequent sequences, where the frequent sequences were determined from a sample of the text, from similar text previously stored, from user input, or from any of the other statistically based techniques which would be apparent to those skilled in the art. The pointer to the character at which compression will begin is placed at the first character in the sequence of text being compressed. As in the FIG. 2 example, the longest match within the dictionary is found and a pointer to this entry is transmitted or stored locally depending on the application of the compression algorithm. The longest match within the dictionary may be found by building a tree structure containing all of the dictionary entries identical to the type of tree structure described above to identify strings to be inserted into the pre-filled dictionary. Another possibility is to use a lookup table or hashing function. In any event, the pointer is then moved by the number of characters transmitted.

As shown in FIG. 11, the dictionary is updated to contain the concatenation of the two previously transmitted dictionary entries. In the first step, there was no previous transmission, so nothing is added to the dictionary. On the second iteration through the processing cycle, the largest match is found, its dictionary entry number is transmitted, the pointer is moved by the appropriate number of characters, and the concatenation of the two previous dictionary entries transmitted is added to the dictionary as a new entry. In this case, "ABC" is added. This process is then repeated in the third step, and the new entry "ABB" is added to the dictionary. This process repeats until the data to be compressed has been exhausted, which in this example is only 3 steps as opposed to 6 steps used in the LZ78 technique of prior art FIG. 2 for the same input sequence. Thus, a pre-filled dictionary containing frequently occurring sequences in accordance with the invention can provide substantial improvement in the encoding/decoding efficiencies of conventional LZ78 compression algorithms.

Of course, as will be appreciated by those skilled in the art, a pre-filled dictionary also will improve the compression performance of the LZ77 data compression variants as well. However, to understand how the pre-filled dictionary of the invention can be used with the LZ77 data compression variants, one must recall the differences between the LZ77 and LZ78 compression techniques noted above. As described with respect to FIG. 1, the LZ77 technique, rather than building a dictionary explicitly, as with LZ78, retains a "window" of text consisting of part of the already compressed portion of the document. At each step, the system identifies the longest substring of the window that appears as a prefix of the text remaining to be compressed. The system encodes this prefix by transmitting a pointer into the window, which specifies either the position in the window at which the copy of the prefix starts or the position in the window at which the copy of the prefix ends, at user election, and then the system transmits the length of the prefix and perhaps an extension. However, if the prefix selected is empty, the system instead transmits an escape code followed by the next literal character to be compressed. The window is updated to include the newly compressed text, and compression continues with the portion of the document immediately following the prefix. The LZ77 technique does not require that a literal character be transmitted together with each prefix that is transmitted. As a result, the variants of the LZ77 technique are generally more efficient than the LZ78 technique and are used in many popular compression programs such as gzip and PKZIP.

A pre-filled dictionary in accordance with the invention can be incorporated into the LZ77 technique in any of a number of ways. First, and most simply, a standard text can be created which contains many common strings, and this text can be kept prepended to the window throughout the compression of any document. It should be noted that the prepended text is not actually compressed and transmitted, but since it is in the window, the compression software may refer to it in the same way that it refers to text that was recently compressed and transmitted. Thus, at the beginning of the compression process, when no text would otherwise be available to serve as the window, the compression algorithm can still transmit pointers into the text containing common strings. This improves compression performance, especially at the beginning of compression, where the standard LZ77 technique must transmit many literal characters or other short strings due to lack of sufficient text in the window. As compression proceeds, the text containing common strings may optionally be gradually shortened to allow more room in the window for text from the document being compressed. The optimal ratio of pre-filled dictionary text to compressed text can be determined experimentally and will generally vary from one document genre to another. In LZ77, a fixed-sized window of text is generally used for such compression.

Another preferred, but more complicated, technique involves treating the set of pointers used by the compression algorithm as being divided, perhaps unevenly, into two classes. Pointers in the first class refer to positions in the window, which consists of part of the already compressed portion of the document, as in standard LZ77. Pointers in the second class refer to entries in a dictionary that lists frequently occurring strings. This hybrid method in effect combines some of the properties of LZ77 and LZ78. At each step, the system selects, encodes, and transmits a prefix of the remainder of the document by one of two methods. It may follow the LZ77 method, transmitting a pointer to a substring in the window, followed by the length of this substring, or when necessary, transmitting an escape code followed by a literal character. Alternatively, the system may follow the LZ78 method, transmitting a pointer to the longest dictionary entry that is a prefix of the text remaining to be compressed. The latter method is used at any step where such a dictionary entry exists, provided that the method achieves better compression (measured by the ratio of bits transmitted to text length) at that step than the LZ77 method does. One advantage of the hybrid method over LZ77 is that no length needs to be transmitted: each dictionary entry has a fixed length that is permanently stored (or otherwise recorded) in the dictionary. The hybrid method is also more efficient than LZ78 in that dictionary entries are not accompanied by literal characters.

Figure 12:
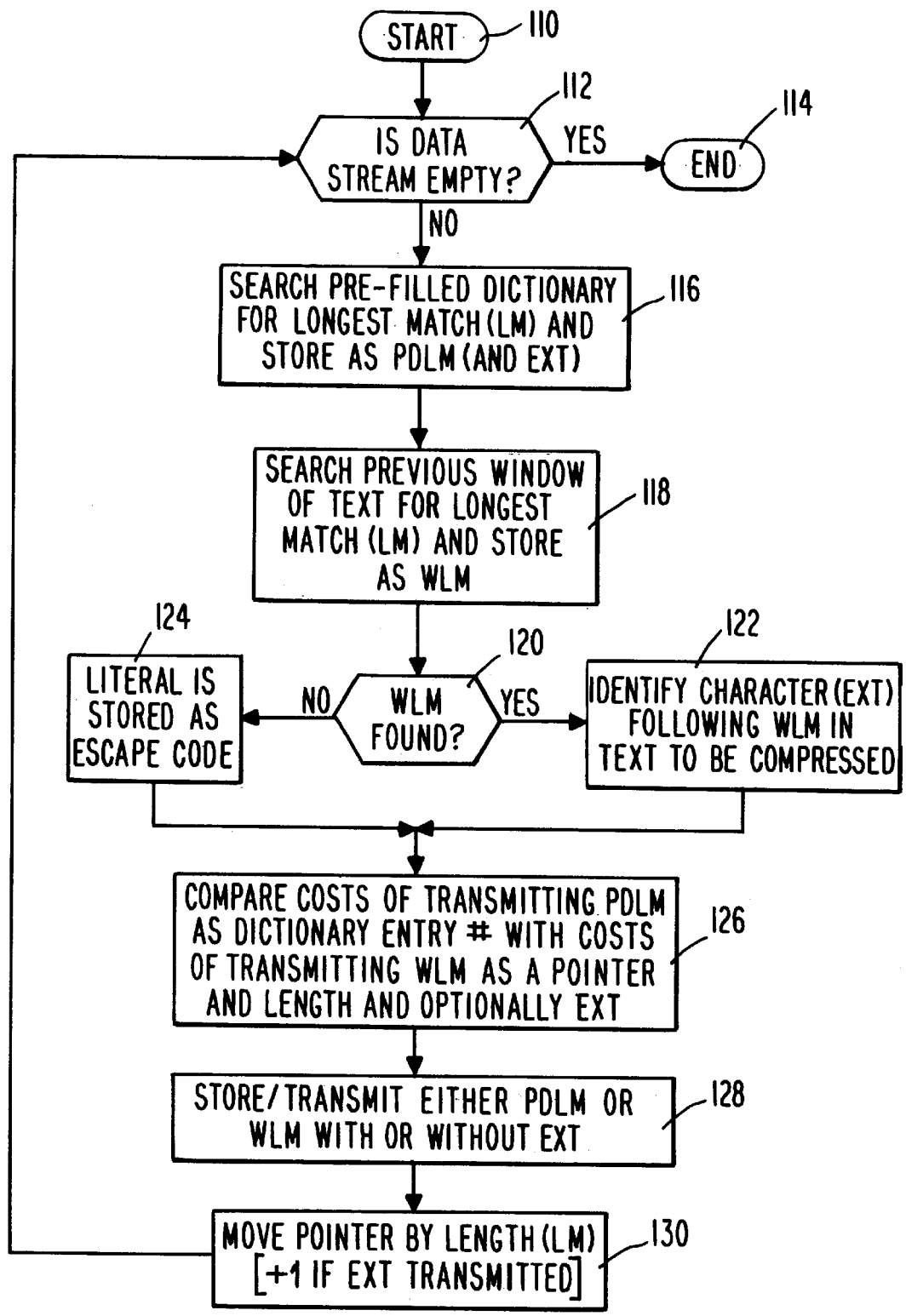
FIG. 12 is a flowchart illustrating a hybrid LZ77/LZ78 compression technique in accordance with the invention.

FIG. 12 is a flowchart of software for implementing such a hybrid LZ77/LZ78 compression technique. In a presently preferred embodiment, such a system is implemented by respectively modifying the LZ78 data compression module 42 of FIG. 7 and the LZ78 data decompression module 80 of FIG. 9 to contain the LZ77 compression and decompression software. As shown, the resulting hybrid routine starts at step 110 by checking at step 112 whether the input data stream is empty. If it is empty, then all input data has been compressed and the routine exits at step 114. However, if the data stream is not empty, and hence there is more input data to compress, the pre-filled dictionary is searched at step 116 for the longest match (LM) with the data sequence following the current pointer. The longest match found (and optionally the character extension EXT) is stored in the LZ77/LZ78 data compression module as PDLM (and EXT). The previous window of text is then searched for the longest match (LM) with the data sequence following the current pointer. The longest match found is stored in the LZ77/LZ78 data compression module as WLM. At step 120, the CPU 3 then determines whether a match was found in step 118, and if so, the character following the longest match WLM in the text to be compressed (EXT) is optionally identified at step 122 (if the extension option is desired). On the other hand, if the CPU 3 determines at step 120 that no match was found in WLM, an escape code is used at step 124 instead of a pointer and length to identify the one character literal EXT pointed at by the current pointer.

At step 126, the costs of transmitting PDLM as a dictionary entry number are compared with the costs of transmitting WLM as a pointer and a length, and, optionally, a one character extension EXT, or as a literal. Specifically, it is determined at step 126 which technique saves the most compared to transmitting the data uncompressed. Generally, this may be accomplished by computing the compression ratio for each technique. Based on the results of step 126, the technique which saves the most of the PDLM and the WLM is then transmitted/stored as desired at step 128 (with or without EXT). Finally, at step 130, the current pointer to the input data is then moved by the length of the longest match or the length of the longest match plus one (if an extension EXT is used). Control then returns to step 112, and the compression is repeated for the next sequence of input data at the current pointer until the data stream is exhausted and the compression process completed.

FIG. 13 is a flowchart of software for implementing a hybrid LZ77/LZ78 decompression technique in accordance with the invention. As shown, the routine starts at step 132 by checking at step 134 whether the input compressed data stream is empty. If it is empty, then all input data has been decompressed and the routine exits at step 136. However, if the compressed data stream is not empty, and hence there is more input data to decompress, the entry corresponding to the current pointer is checked at step 138 to determine whether it is a PDLM or a WLM. For example, whether the reference is a PDLM reference or a WLM reference may be determined by checking how the addressed space is divided up. If the entry in the compressed data stream is a PDLM, then the LZ78 techniques described with respect to FIG. 10 are followed. In particular, the dictionary entry in the pre-filled dictionary corresponding to the current pointer is looked up at step 140 using the dictionary entry number. The corresponding dictionary entry so found is then stored in a LZ77/LZ78 decompression module as E. If desired, the decompressed data is also displayed to the user. At step 142, if the optional extension EXT was sent (as determined prior to running the algorithm), the character in the input compressed data stream following the current dictionary entry number is then stored in the LZ77/LZ78 decompression module as C. If desired, that character is also displayed to the user. At step 144, the character C and the dictionary entry E are concatenated and stored in the LZ77/LZ78 data decompression module as ADD. Once again, if desired, the resulting concatenation is also displayed to the user.

On the other hand, if it is determined at step 138 that the entry in the compressed data stream is a WLM, then the entry at the pointer is used at step 146 to lookup the entry in the previous window of text pointed to by that entry. That value is stored in the LZ77/LZ78 decompression module as E. If desired, the decompressed data is also displayed to the user. At step 148, if the optional extension EXT was sent (as determined prior to running the algorithm), the character in the input compressed data stream following the current entry is then stored in the LZ77/LZ78 decompression module as C. If desired, that character is also displayed to the user. At step 150, the character C and the dictionary entry E are concatenated and stored in the LZ77/LZ78 data decompression module as ADD. Once again, if desired, the resulting concatenation is also displayed to the user.

At the completion of either step 144 or step 150, the current pointer to the input data stream is advanced to the beginning of the next entry in the data stream at step 152. Control then returns to step 134, and the decompression process is repeated for the next sequence of input data until the input compressed data stream is exhausted. The decompression process is then complete.

FIG. 14 is an example of text compression using the hybrid technique of FIGS. 12 and 13. In the example, the alphabet is assumed to contain 7 characters (A,B,C,D,E,F,G), and the data to be compressed is "ABCBDEFGABC." As shown, the compression dictionary initially contains the frequent sequences "ABC" and "DEF", where the frequent sequences were determined using any of the techniques described above or from any other statistically based technique as would be apparent to one skilled in the art. FIG. 14 illustrates the way compression was achieved, where there are three options: pre-filled dictionary, LZ77 reference, and LZ77 literal. In the example of FIG. 14, no character extension is used. During compression, a bit is used to indicate whether the following information is a literal or either a dictionary reference or a LZ77 reference. The latter two options share a common address space, but a length is only used if an LZ77 style reference is used.

As illustrated in FIG. 14, at the start of compression, the pointer to the character at which compression will begin is placed at the first character in the sequence of text being compressed. At step 0, the longest match is found in the compression dictionary, and a pointer to this entry (D0) is transmitted or stored locally depending on the application of the compression algorithm. The pointer is then moved by the number of characters transmitted. At step 1, an LZ77 reference is transmitted since neither "B" nor "BD" are in the compression dictionary. The flag indicates that a LZ77 reference (2,1) is transmitted, where "2" is a pointer to the second entry in the current window, and "1" is the length. The pointer is then moved one character prior to step 2. At step 2, the longest match is found in the compression dictionary, and a pointer to this entry (D1) is transmitted or stored locally depending on the application of the compression algorithm. The pointer is then moved by the number of characters transmitted prior to step 3. At step 3, an LZ77 literal is sent since the character "G" is not in the compression window or the compression dictionary. The pointer is then moved one character prior to step 4. At step 4, the longest match is found in the compression dictionary, and a pointer to this entry (D0) is transmitted or stored locally depending on the application of the compression algorithm. The pointer is then moved by the number of characters transmitted. In step 4, the dictionary entry was used instead of the window entry since it was assumed to be cheaper than the LZ77 pointer reference. Since the pointer is at the end of the text to be compressed, the encoding process is completed.

Any of the standard improvements to LZ77, such as applying some form of compression to the literals, lengths, and addresses being transmitted, seeding the dictionary or window so that no literals need to be transmitted, and the like, may be equally well applied to any of the above-mentioned embodiments which are extensions of the LZ77 compression technique. Also, as described above, different dictionaries (or different texts to prepend to the window) can be used for different genres of data being transmitted. An initial code number sent at the beginning of each message would then indicate which dictionary or prepended text was being used (e.g., the one for English prose, for computer software, or for business transaction forms), or a special code would be transmitted indicating that the dictionary or prepended text has been specially derived from a previously transmitted text.

In a sample implementation of the techniques of the invention, a set of pre-filled data compression dictionaries is distributed to a number of servers that regularly exchange compressed documents amongst themselves. As described above, the dictionaries may be combined before distribution to save transmission costs. Periodically, a new set of pre-filled dictionaries is distributed to supplement the old set of pre-filled dictionaries. The new set might include dictionaries for new genres, as well as more up-to-date dictionaries for old genres which reflect terminology changes. Ideally, the new dictionaries are constructed so that they overlap substantially with the old dictionaries, whereby the combined representation for all the new and old dictionaries does not differ much from the combined representation for the old dictionaries alone. A file listing the changes between the two representations of a pre-filled dictionary is then distributed. Upon receiving this file, each of the servers modifies its combined dictionary representation in order to add the new dictionaries. The old dictionaries may now be either retained in the combined representation or deleted from it, depending on whether or not they will be needed in order to decompress old files. Such a technique will lead to substantially reduced data transmission and storage costs, particularly between two servers which often exchange files of the same genre.

For example, a simulation of the invention was performed using half of a corpus of data, where the pre-filled dictionary was learned from the other half. For comparison purposes, the data was compressed using "gzip", a simulation of "gzip", and a simulation of "gzip" with a pre-filled dictionary in accordance with the invention. A simulation was used since "gzip" would have to be modified to be used with a pre-filled dictionary in accordance with the invention. The simulation of "gzip" was tested without the pre-filled dictionary merely to verify that the simulation approximated the performance of "gzip" before the addition of the pre-filled dictionary. The following results were obtained:
Compression percentage with gzip: 50.6
Compression percentage with simulation: 50.7
Compression percentage with simulation using dictionary: 62.8
Those skilled in the art will appreciate that a 12 percentage point decrease in file size is quite substantial. In this example, that amounts to approximately a 25% memory savings!

Although numerous embodiments of the invention and numerous extensions of the inventive concept have been described above, those skilled in the art will readily appreciate that many additional modifications are possible in the exemplary embodiment without materially departing from the novel teachings and advantages of the invention.

For example, as noted above, the pre-filled dictionaries of the invention may be formed in any of a number of ways and may be used with any of a number of variations of the basic Lempel-Ziv compression technique. Moreover, compression performance may be optimized by separately monitoring or tracking the compression performance of the pre-filled data compression dictionary and the data specific compression dictionary. For example, if the pre-filled data compression dictionary is not providing better data compression than the data specific compression dictionary, then in the event that the data specific dictionary becomes full and needs to be reset, the pre-filled data compression dictionary is replaced by the data specific dictionary and the data specific dictionary is reset. On the other hand, in the event that the pre-filled data compression dictionary is more useful for compression, it is retained and the data specific compression dictionary is reset. To determine which dictionary is providing better compression than another dictionary, the savings associated with each of the dictionaries is maintained while compression is proceeding. The length of each of the strings compressed using each of the dictionaries is also kept, as is the amount of data resulting from the portion of the compression effected by each dictionary. A threshold is chosen below which the pre-filled dictionary is said to be yielding so little improvement that allowing the data-specific dictionary to grow further would be better. This is done both globally (for the entire document compressed so far) as well as locally by maintaining several different sets of these data. In effect, this process allows the entire address space afforded to the pre-filled data compression dictionary and the data specific compression dictionary to be utilized by the data specific dictionary when the pre-filled dictionary is not providing an improvement to the compression process.

Moreover, a least recently used (LRU) method of the type described by Storer in U.S. Pat. No. 4,876,541 makes it unnecessary to keep the two dictionaries separate, for the least recently used entry is always discarded, regardless of which dictionary it came from. It should be noted that, in this context, "used" includes reading or writing a code as part of a compressed data stream, but the entry of the code into the dictionary on the first appearance of its string may or may not be counted as a "use."

In addition, multiple pre-filled data compression dictionaries may be used in the compression process at the expense of reducing the size of the data specific dictionary. In the most extreme case, the data specific dictionary could be eliminated entirely and the entire address space normally shared by the pre-filled dictionary and the data specific dictionary would be shared by the relevant pre-filled dictionaries. Of course, in this case, all character sequences, words, and phrases in the text to be compressed would need to be present in one or more pre-filled data compression dictionaries, which is quite possible when the pre-filled dictionary or dictionaries are large enough to contain all combinations of characters likely to occur in the text to be compressed. Moreover, even if all combinations of characters are not found in the pre-filled data compression dictionary, combinations not found could simply be stored uncompressed and/or the pre-filled dictionary could be updated during compression to include that character combination. On the other hand, an algorithm could be used to determine whether the entire character set is present in the pre-filled data compression dictionary created by the software described with respect to FIG. 6, which performs the frequency analysis of the collection of documents from which the pre-filled dictionary is formed. In the event that all of the characters are not present, those characters which are absent will be inserted into the pre-filled data compression dictionary, while the least frequent codewords are eliminated, thereby guaranteeing that no escape sequences need be sent to indicate that the following character is absent from the dictionary.

As another modification to the preferred embodiments of the invention, the codeword addresses of the dictionary entries may themselves be encoded using a technique such as Huffman coding so that the more frequently used addresses can be represented using fewer bits. Similarly, the extension characters may be encoded using a variable length coding, such as Huffman coding, to improve performance. In such a case, it is not necessary to limit the size of the data specific dictionary, and hence unnecessary to ever flush the data specific dictionary, for the Lempel-Ziv codewords are just integers. These integers are then encoded by variable-length bit sequences. Moreover, if the distribution of these integer codewords varies through the document, so that its local entropy is lower than its global entropy, then adaptive versions of the variable-length coding scheme, such as adaptive Huffman coding or adaptive arithmetic coding, should be used.

In accordance with this technique, the size of the code being transmitted using the encoding for codewords is known and is based on the number of codewords in the dictionary. A list of recently used codewords can be maintained and at such a time as the recently used codewords form a small subset of the entire space of codewords involved in the compression of codewords scheme, compression of these codewords can be restarted. That is, a new dictionary to compress codewords can be created. This new dictionary could be constructed from recently used codewords on the assumption that recently used codewords are more likely to be used again locally, while those which have not been recently used are less likely to be used again.

One skilled in the art may also choose to store a data specific compression dictionary created during compression of a particular document as a pre-filled data compression dictionary for use in the compression of other related documents. On the other hand, the data specific dictionary may be analyzed to determine whether particular entries should be included in other pre-filled data compression dictionaries.

Accordingly, all such modifications are intended to be included within the scope of this invention as defined in the following claims.

We claim:

1. A data compression method for compressing a text containing a sequence of characters, comprising the steps of:
    (a) selecting a pre-filled data compression dictionary containing predetermined combinations of characters likely to occur frequently in said sequence of characters;
    (b) initializing a pointer to a first character in said sequence of characters for compression;
    (c) comparing characters starting at said pointer with sequences of characters stored in said pre-filled data compression dictionary and determining a longest match of said characters starting at said pointer with said sequences of characters stored in said pre-filled data compression dictionary;
    (d) storing a dictionary pointer to said longest match in said pre-filled data compression dictionary in a memory as a compressed representation of said characters making up said longest match;
    (e) moving said pointer to a character in said sequence of characters which follows said longest match; and
    (f) repeating steps c–e for all characters in said sequence of characters to be compressed.

2. A method as in claim 1, comprising the further step of creating said pre-filled data compression dictionary by performing the steps of:
    analyzing character sequences in at least one sample sequence of characters which is representative of the sequence of characters to be compressed to determine the frequency of occurrence of said character sequences in said at least one sample sequence of characters; and
    selecting as said predetermined combinations those character sequences in said at least one sample sequence of characters which occur most frequently in said at least one sample sequence of characters.

3. A method as in claim 2, wherein said analyzing step comprises the steps of determining a number of occurrences of each of said character sequences in said at least one sample sequence of characters and calculating for each character sequence a product of the number of occurrences of said each character sequence with the difference in bit length of said each character sequence and a bit length of said dictionary pointer.

4. A method as in claim 3, wherein said predetermined combinations selecting step comprises the step of selecting for storage in said pre-filled data compression dictionary those data sequences having the largest product determined in said product calculating step.

5. A method as in claim 4, comprising the further steps of determining whether an entire character set is present in said pre-filled data compression dictionary, and, in the event that all of the characters in said entire character set are not present in said pre-filled data compression dictionary, inserting those characters in said character set which are absent from said pre-filled data compression dictionary into said pre-filled data compression dictionary as new dictionary entries in place of dictionary entries having the smallest product determined in said product calculating step.

6. A method as in claim 1, wherein said step of selecting said pre-filled data compression dictionary comprises the steps of performing steps b–e for a subset of characters of said sequence of data characters to be compressed for a plurality of different pre-filled data compression dictionaries to determine which one of said plurality of different pre-filled data compression dictionaries provides the most compression for said subset of characters, and selecting said one pre-filled data compression dictionary as said pre-filled data compression dictionary for use in compressing said sequence of characters.

7. A method as in step 6, wherein said step of selecting said one pre-filled data compression dictionary comprises the step of selecting an empty data compression dictionary in the event that it is determined while performing steps b–e for said subset of characters of said sequence of data characters to be compressed that starting with an empty data compression dictionary would allow for the most compression of said sequence of data characters.

8. A method as in claim 1, comprising the further step of (g) transmitting to a recipient said dictionary pointer as said compressed representation of said characters making up said longest match.

9. A method as in claim 8, wherein said step of selecting said pre-filled data compression dictionary comprises the steps of selecting a pre-filled data compression dictionary out of a plurality of pre-filled data compression dictionaries based on whether or not said plurality of pre-filled data compression dictionaries are available to said recipient of data transmitted in step g.

10. A method as in claim 1, wherein said step of selecting a pre-filled data compression dictionary comprises the step of selecting multiple pre-filled data compression dictionaries for use during compression of said sequence of characters to be compressed.

11. A method as in claim 1, comprising the further step of encoding said dictionary pointer so that said dictionary pointer can be represented using fewer address bits.

12. A method as in claim 1, comprising the further step of storing with said compressed representation of said characters making up said longest match a reference to a pre-filled data compression dictionary to be used during a decompression process.

13. A method as in claim 1, comprising the further step of storing a plurality of pre-filled data compression dictionaries containing different genres of text data, wherein said pre-filled data compression dictionary selecting step comprises the step of selecting said pre-filled data compression dictionary from said plurality of pre-filled data compression dictionaries whereby the selected pre-filled data compression dictionary contains data from the most similar genre to said sequence of characters to be compressed.

14. A method as in claim 13, wherein said step of storing said plurality of pre-filled compression dictionaries comprises the step of arranging said plurality of pre-filled data compression dictionaries hierarchically by genre of text data contained within the respective pre-filled data compression dictionaries.

15. A method as in claim 13, wherein said step of storing said plurality of pre-filled compression dictionaries comprises the step of storing common entries in said plurality of pre-filled data compression dictionaries only one time on a storage medium whereby said common entries are shared by said plurality of pre-filled data compression dictionaries.

16. A data compression method for compressing a text containing a sequence of characters, comprising the steps of:
  (a) selecting a pre-filled data compression dictionary containing predetermined combinations of characters likely to occur frequently in said sequence of characters;
  (b) initializing a data specific data compression dictionary;
  (c) initializing a pointer to a first character in said sequence of characters for compression;
  (d) comparing characters starting at said pointer with sequences of characters stored in said pre-filled data compression dictionary and said data specific data compression dictionary and determining a dictionary entry number of a longest match of said characters starting at said pointer with said sequences of characters stored in said pre-filled data compression dictionary and said data specific data compression dictionary;
  (e) storing said dictionary entry number and an extension character in a memory as a compressed representation of said characters making up said longest match and said extension character, said extension character being that character in said sequence of characters to be compressed which occurs after said longest match starting at said pointer;
  (f) selectively storing said characters making up said longest match and said extension character in said data specific data compression dictionary as a new dictionary entry;
  (g) moving said pointer to a character in said sequence of characters which follows said extension character; and
  (h) repeating steps d–g for all characters in said sequence of characters to be compressed.

17. A method as in claim 16, comprising the further steps of monitoring compression performance of said pre-filled data compression dictionary and said data specific data compression dictionary during compression of said sequence of characters and, when said data specific data compression dictionary becomes full during compression of said sequence of characters, resetting the data compression dictionary determined in said monitoring step to be providing the lesser data compression performance and using the data compression dictionary determined in said monitoring step to be providing the greater data compression performance as said pre-filled data compression dictionary for compression of subsequent characters in said sequence of characters to be compressed.

18. A method as in claim 16, comprising the further step of storing said data specific data compression dictionary with the new dictionary entries stored therein during compression of said sequence of characters as at least a portion of a pre-filled data compression dictionary for use in compression of a different sequence of characters.

19. A method as in claim 16, comprising the further step of storing with said compressed representation of said characters making up said longest match and said extension character at least one of (1) an indication of which pre-filled data compression dictionary was used to form said compressed representation; (2) an indication of how dictionary address space is allocated between said data specific data compression dictionary and said pre-filled data compression dictionary, (3) an indication of a Lempel-Ziv algorithm variant to be used to decompress said compressed representation of said characters, and (4) an indication of what technique to follow when said data specific data compression dictionary becomes filled.

20. A method as in claim 16, wherein said pre-filled data compression dictionary selecting step comprises the step of selecting said pre-filled data compression dictionary from a plurality of pre-filled data compression dictionaries containing different genres of text data, whereby the selected pre-filled data compression dictionary contains data from the most similar genre to said sequence of characters to be compressed.

21. A method as in claim 20, comprising the further step of repeating steps (b)–(g) for a different text from the same genre as said text using the data specific data compression dictionary formed during the compression of said text as the pre-filled data compression dictionary for compression of said different text.

22. A method as in claim 21, wherein said pre-filled data compression dictionary selecting step comprises the step of specifying whether the pre-filled data compression dictionary is formed during the compression of another text.

23. A data compression method for compressing a text containing a sequence of characters, comprising the steps of:
  (a) initializing a character window which contains a predetermined number of characters;
  (b) appending a pre-filled data compression dictionary containing predetermined combinations of characters likely to occur frequently in said sequence of characters to said character window;
  (c) initializing a pointer to a first character in said sequence of characters for compression;
  (d) comparing characters starting at said pointer with sequences of characters in said character window with said pre-filled data compression dictionary appended thereto and determining a window pointer to and a length of a longest match of said characters starting at said pointer with said sequences of characters in said character window with said pre-filled data compression dictionary appended thereto;
  (e) storing said window pointer and said length of said longest match in a memory as a compressed representation of said characters making up said longest match;
  (f) updating said character window to include the characters making up said longest match;
  (g) moving said pointer to a character in said sequence of characters which follows said longest match; and (h) repeating steps d–g for all characters in said sequence of characters to be compressed.

24. A method as in claim 23, comprising the further step of storing in said memory a literal character pointed to by said pointer when a sequence of characters pointed to by said pointer is not found in said character window with said pre-filled data compression dictionary appended thereto in step d.

25. A method as in claim 23, comprising the further step of transmitting to a recipient said window pointer and said length of said longest match as said compressed representation of said characters making up said longest match.

26. A data compression method for compressing a text containing a sequence of characters, comprising the steps of:
   (a) selecting a pre-filled data compression dictionary containing predetermined combinations of characters likely to occur frequently in said sequence of characters;
   (b) initializing a character window which contains a predetermined number of characters;
   (c) initializing a pointer to a first character in said sequence of characters for compression;
   (d) comparing characters starting at said pointer with sequences of characters stored in said pre-filled data compression dictionary and with sequences of characters in said character window and determining longest matches of said characters starting at said pointer with said sequences of characters stored in said pre-filled data compression dictionary and with sequences of characters in said character window;
   (e) determining whether greater compression will be obtained by representing said characters starting at said pointer as a dictionary entry number of a longest match of said characters starting at said pointer with said sequences of characters stored in said pre-filled data compression dictionary or by representing said characters starting at said pointer as a window pointer to and a length of a longest match of said characters starting at said pointer with said sequences of characters in said character window;
   (f) storing said window pointer and said length of said longest match in a memory as a compressed representation of said characters making up said longest match when it is determined in step e that greater compression will be obtained by representing said characters starting at said pointer as said window pointer to and said length of said longest match of said characters starting at said window pointer with said sequences of characters in said character window; otherwise storing said dictionary entry number of said longest match of said characters starting at said pointer with said sequences of characters stored in said pre-filled data compression dictionary;
   (g) updating said character window to include the characters making up said longest match;
   (h) moving said pointer to a character in said sequence of characters which follows said longest match; and
   (I) repeating steps d–h for all characters in said sequence of characters to be compressed.

27. A method as in claim 26, comprising the further step of transmitting to a recipient said window pointer and said length of said longest match when it is determined in step e that greater compression will be obtained by representing said characters starting at said pointer as said window pointer to and said length of said longest match of said characters starting at said window pointer with said sequences of characters in said character window; otherwise transmitting to said recipient said dictionary entry number of said longest match of said characters starting at said pointer with said sequences of characters stored in said pre-filled data compression dictionary.

28. A method of decompressing a compressed representation of a sequence of characters, said compressed representation comprising dictionary pointers to respective longest matches of sequences of characters starting at a pointer to particular characters within said sequence of characters with sequences of characters stored in a pre-filled data compression dictionary, said pre-filled data compression dictionary containing predetermined combinations of characters likely to occur frequently in said sequence of characters, said decompressing method comprising the steps of:
   (a) initializing a pointer to a first dictionary pointer in said compressed representation of said characters;
   (b) retrieving a dictionary entry from said pre-filled data compression dictionary using said dictionary pointer pointed to by said pointer;
   (c) storing said dictionary entry as a decompressed representation of the characters making up said longest match;
   (d) moving said pointer to a next dictionary pointer in said compressed representation of said characters; and
   (e) repeating steps b–d for all dictionary pointers in said compressed representation of said characters until all compressed characters in said sequence of characters have been decompressed.

29. A method as in claim 28, comprising the further step of extracting from said compressed representation of said characters at least one of: (1) the identity of the pre-filled data compression dictionary to use during decompression, and (2) an indication of a Lempel-Ziv algorithm variant to be used to decompress said compressed representation of said characters.

30. A method of decompressing a compressed representation of a sequence of characters, said compressed representation comprising extension characters and dictionary entry numbers of respective longest matches of sequences of characters starting at a pointer to particular characters within said sequence of characters with sequences of characters stored in a pre-filled data compression dictionary and a data specific data compression dictionary, said extension character being that character in the sequence of characters which occurs after the longest match starting at said pointer, said pre-filled data compression dictionary containing predetermined combinations of characters likely to occur frequently in said sequence of characters, said decompressing method comprising the steps of:
   (a) initializing a data specific data decompression dictionary;
   (b) initializing a pointer to a first dictionary entry number in said compressed representation of said characters;
   (c) retrieving a dictionary entry and an extension character from one of said pre-filled data compression dictionary and said data specific data decompression dictionary using a dictionary entry number pointed to by said pointer;
   (d) selectively storing said characters making up said longest match and said extension character into said data specific data decompression dictionary;
   (e) moving said pointer to a next dictionary entry number in said compressed representation of said characters; and (f) repeating steps c–e for all dictionary entry numbers and extension characters in said compressed representation of said characters until all compressed characters in said sequence of characters have been decompressed.

31. A method as in claim 30, comprising the further step of extracting from said compressed representation of said characters at least one of: (1) an indication of the pre-filled data compression dictionary to use during decompression, (2) an indication of how dictionary address space is allocated between said data specific data compression dictionary and said pre-filled data compression dictionary, (3) an indication of a Lempel-Ziv algorithm variant to be used to decompress said compressed representation of said characters, and (4) an indication of what technique to follow when said data specific data compression dictionary becomes filled.

32. A method of decompressing a compressed representation of a sequence of characters, said compressed representation comprising window pointers and lengths of respective longest matches of sequences of characters starting at a pointer to particular characters within said sequence of characters with sequences of characters in a character window of a predetermined size with a pre-filled data compression dictionary appended thereto, said pre-filled data compression dictionary containing predetermined combinations of characters likely to occur frequently in said sequence of characters, said decompressing method comprising the steps of:

(a) initializing a pointer to a first window pointer and length in said compressed representation of said characters;

(b) retrieving a number of characters determined by said length starting at a character within a current character window pointed to by a window pointer which is pointed to by said pointer;

(c) storing said retrieved characters as a decompressed representation of the characters making up said longest match;

(d) moving said pointer to a next window pointer and length in said compressed representation of said characters; and (e) repeating steps b–d for all window pointers and lengths in said compressed representation of said characters until all compressed characters in said sequence of characters have been decompressed.

33. A method as in claim 32, comprising the further step of extracting from said compressed representation of said characters at least one of: (1) the identity of the pre-filled data compression dictionary to use during decompression, and (2) an indication of a Lempel-Ziv algorithm variant to be used to decompress said compressed representation of said characters.

34. A method of decompressing a compressed representation of a sequence of characters, said compressed representation comprising (1) window pointers and lengths of respective longest matches of sequences of characters starting at a pointer to particular characters within said sequence of characters with sequences of characters in a character window of a predetermined size and (2) dictionary entry numbers of respective longest matches of sequences of characters starting at said pointer to particular characters within a pre-filled data decompression dictionary, said pre-filled data compression dictionary containing predetermined combinations of characters likely to occur frequently in said sequence of characters, said decompressing method comprising the steps of:

(a) initializing a pointer to a first entry in said compressed representation of said characters;

(b) determining whether a current entry in said compressed representation of said characters pointed to by said pointer is (1) a window pointer and a length or (2) a dictionary entry number;

(c) if said current entry is a window pointer and a length, retrieving a number of characters determined by said length starting at a character within a current character window pointed to by said window pointer;

(d) if said current entry is a dictionary entry number, retrieving characters at a dictionary entry in said pre-filled data decompression dictionary identified by said dictionary entry number;

(e) storing characters retrieved in steps c or d as a decompressed representation of the characters making up the longest match for the current entry;

(f) moving said pointer to a next entry in said compressed representation of said characters; and (g) repeating steps b–f for all entries in said compressed representation of said characters until all compressed characters in said sequence of characters have been decompressed.

35. A method as in claim 34, comprising the further step of extracting from said compressed representation of said characters at least one of: (1) the identity of the pre-filled data compression dictionary to use during decompression, and (2) an indication of a Lempel-Ziv algorithm variant to be used to decompress said compressed representation of said characters.

36. A data compression system for compressing a text containing a sequence of characters, comprising:

a pre-filled data compression dictionary containing predetermined combinations of characters likely to occur frequently in said sequence of characters;

a memory which stores said text after it has been compressed; and compressing means for performing the steps of (a) initializing a pointer to a first character in said sequence of characters for compression, (b) comparing characters starting at said pointer with sequences of characters stored in said pre-filled data compression dictionary and determining a longest match of said characters starting at said pointer with said sequences of characters stored in said pre-filled data compression dictionary, (c) storing a dictionary pointer to said longest match in said pre-filled data compression dictionary in said memory as a compressed representation of said characters making up said longest match, (d) moving said pointer to a character in said sequence of characters which follows said longest match, and (e) repeating steps b–d for all characters in said sequence of characters to be compressed.

37. A system as in claim 36, further comprising means for creating said pre-filled data compression dictionary, said pre-filled data compression dictionary creating means inserting into said pre-filled data compression dictionary those combinations of characters which most frequently occur in at least one sample sequence of characters which is representative of the sequence of characters to be compressed.

38. A system as in claim 37, wherein said pre-filled data compression dictionary creating means inserts into said pre-filled data compression dictionary those combinations of characters in at least one sample sequence of characters which is representative of the sequence of characters to be compressed which have the greatest product of (a) a number of occurrences of each of said combinations of characters in said at least one sample sequence of characters with (b) a difference in bit length of each said combination of characters and a bit length of said dictionary pointer.

39. A system as in claim 38, wherein said pre-filled data compression dictionary creating means determines whether an entire character set of said sequence of characters to be compressed is present in said pre-filled data compression dictionary, and, in the event that all of the characters in said entire character set are not present in said sequence of characters to be compressed, inserts those characters in said character set which are absent from said pre-filled data compression dictionary into said pre-filled data compression dictionary as new dictionary entries in place of dictionary entries which have the smallest product determined by said pre-filled data compression dictionary creating means.

40. A system as in claim 36, wherein said pre-filled data compression dictionary is one of a number of pre-filled data compression dictionaries, said one pre-filled data compression dictionary containing those combinations of characters which provide more compression of a subset of characters of said sequence of data characters to be compressed than the compression provided to said subset of characters of said sequence of data characters by each of the rest of said number of pre-filled data compression dictionaries.

41. A system as in claim 36, wherein said memory is at a location remote from said compressing means, further comprising means for transmitting said dictionary pointer as said compressed representation of said characters making up said longest match from said compressing means to said memory.

42. A system as in claim 41, wherein said pre-filled data compression dictionary is one of a number of pre-filled data compression dictionaries which is also available at said remote location.

43. A system as in claim 36, wherein said compressing means comprises means for encoding said dictionary pointer so that said dictionary pointer can be represented using fewer address bits.

44. A system as in claim 36, wherein said compressing means stores in said memory with said compressed representation of said characters making up said longest match a reference to a pre-filled data compression dictionary to be used during a decompression process.

45. A system as in claim 36, wherein said memory comprises at least one of a hard disk, a RAM, a CD ROM, a floppy disk, and an optical disk.

46. A system as in claim 36, further comprising a dictionary memory for storing a plurality of pre-filled data compression dictionaries containing different genres of text data, whereby the pre-filled data compression dictionary used to compress said text contains data from the most similar genre to said sequence of characters to be compressed.

47. A system as in claim 46, wherein said plurality of pre-filled data compression dictionaries are arranged in said dictionary memory hierarchically by genre of text data contained within the respective pre-filled data compression dictionaries.

48. A system as in claim 46, wherein said plurality of pre-filled data compression dictionaries are stored in said dictionary memory such that common entries in said plurality of pre-filled data compression dictionaries are stored in said dictionary memory only one time and are shared by said plurality of pre-filled data compression dictionaries.

49. A data compression system for compressing a text containing a sequence of characters, comprising:

a pre-filled data compression dictionary containing predetermined combinations of characters likely to occur frequently in said sequence of characters;

a data specific data compression dictionary;

a memory which stores said text after it has been compressed; and compressing means for performing the steps of (a) initializing a pointer to a first character in said sequence of characters for compression, (b) comparing characters starting at said pointer with sequences of characters stored in said pre-filled data compression dictionary and said data specific data compression dictionary and determining a dictionary entry number of a longest match of said characters starting at said pointer with said sequences of characters stored in said pre-filled data compression dictionary and said data specific data compression dictionary, (c) storing said dictionary entry number and an extension character in said memory as a compressed representation of said characters making up said longest match and said extension character, said extension character being that character in said sequence of characters to be compressed which occurs after said longest match starting at said pointer, (d) selectively storing said characters making up said longest match and said extension character in said data specific data compression dictionary as a new dictionary entry, (e) moving said pointer to a character in said sequence of characters which follows said extension character, and (f) repeating steps b–e for all characters in said sequence of characters to be compressed.

50. A system as in claim 49, wherein said compressing means further comprises means for monitoring compression performance of said pre-filled data compression dictionary and said data specific data compression dictionary during compression of said sequence of characters, means for resetting the data compression dictionary determined by said monitoring means to be providing the lesser data compression performance when said data specific data compression dictionary becomes full during compression of said sequence of characters, and means for substituting the data compression dictionary determined by said monitoring means to be providing the greater data compression performance for said pre-filled data compression dictionary for compression of subsequent characters in said sequence of characters to be compressed.

51. A system as in claim 49, wherein said pre-filled data compression dictionary and said data specific data compression dictionary share a common memory, said data specific data compression dictionary being stored in said common memory with any new dictionary entries stored therein during compression of said sequence of characters as at least a portion of a pre-filled data compression dictionary for use in compression of a different sequence of characters of a different text.

52. A system as in claim 49, wherein said compressing means stores in said memory with said compressed representation of said characters making up said longest match and said extension character at least one of (1) an indication of which pre-filled data compression dictionary was used to form said compressed representation, (2) an indication of how dictionary address space is allocated between said data specific data compression dictionary and said pre-filled data compression dictionary, (3) an indication of a Lempel-Ziv algorithm variant to be used to decompress said compressed representation of said characters, and (4) an indication of what technique to follow when said data specific data compression dictionary becomes filled.

53. A system as in claim 49, further comprising a dictionary memory for storing a plurality of pre-filled data compression dictionaries containing different genres of text data, whereby the pre-filled data compression dictionary used to compress said text contains data from the most similar genre to said sequence of characters to be compressed.

54. A system as in claim 53, wherein said compressing means repeats steps b–e for a different text from the same genre as said text using the data specific data compression dictionary entries stored during the compression of said text as the pre-filled data compression dictionary for compression of said different text.

55. A system as in claim 54, wherein said pre-filled data compression dictionary contains means for indicating whether the pre-filled data compression dictionary is formed during the compression of another text.

56. A data compression system for compressing a text containing a sequence of characters, comprising:

a dictionary memory which stores a character window which contains a predetermined number of characters and a pre-filled data compression dictionary containing predetermined combinations of characters likely to occur frequently in said sequence of characters;

a compressed data memory which stores said text after it has been compressed; and compressing means for performing the steps of (a) initializing a pointer to a first character in said sequence of characters for compression, (b) comparing characters starting at said pointer with sequences of characters in said dictionary memory and determining a window pointer to and a length of a longest match of said characters starting at said pointer with said sequences of characters in said pre-filled data compression dictionary and said character window, (c) storing said window pointer and said length of said longest match in said compressed data memory as a compressed representation of said characters making up said longest match, (d) updating said character window to include the characters making up said longest match, (e) moving said pointer to a character in said sequence of characters which follows said longest match, and (f) repeating steps b–e for all characters in said sequence of characters to be compressed.

57. A system as in claim 56, wherein said compressing means stores in said compressed data memory in step c a literal character pointed to by said pointer when a sequence of characters pointed to by said pointer is not found in said character window or said pre-filled data compression dictionary in step b.

58. A system as in claim 56, wherein said compressed data memory is at a location remote from said compressing means, further comprising means for transmitting said window pointer and said length of said longest match as said compressed representation of said characters making up said longest match from said compressing means to said compressed data memory.

59. A data compression system for compressing a text containing a sequence of characters, comprising:

a pre-filled data compression dictionary containing predetermined combinations of characters likely to occur frequently in said sequence of characters;

a character window which contains a predetermined number of characters;

a compressed data memory which stores said text after it has been compressed; and compressing means for performing the steps of (a) initializing a pointer to a first character in said sequence of characters for compression, (b) comparing characters starting at said pointer with sequences of characters stored in said pre-filled data compression dictionary and with sequences of characters in said character window and determining longest matches of said characters starting at said pointer with said sequences of characters stored in said pre-filled data compression dictionary and with sequences of characters in said character window, (c) determining whether greater compression will be obtained by representing said characters starting at said pointer as a dictionary entry number of a longest match of said characters starting at said pointer with said sequences of characters stored in said pre-filled data compression dictionary or by representing said characters starting at said pointer as a window pointer to and a length of a longest match of said characters starting at said pointer with said sequences of characters in said character window, (d) storing said window pointer and said length of said longest match in said compressed data memory as a compressed representation of said characters making up said longest match when it is determined in step c that greater compression will be obtained by representing said characters starting at said pointer as said window pointer to and said length of said longest match of said characters starting at said window pointer with said sequences of characters in said character window; otherwise storing said dictionary entry number of said longest match of said characters starting at said pointer with said sequences of characters stored in said pre-filled data compression dictionary, (e) updating said character window to include the characters making up said longest match, (f) moving said pointer to a character in said sequence of characters which follows said longest match, and (g) repeating steps b–f for all characters in said sequence of characters to be compressed.

60. A system as in claim 59, wherein said compressed data memory is at a location remote from said compressing means, further comprising means for transmitting to said compressed data memory said window pointer and said length of said longest match when it is determined by said compressing means in step c that greater compression will be obtained by representing said characters starting at said pointer as said window pointer to and said length of said longest match of said characters starting at said window pointer with said sequences of characters in said character window; otherwise transmitting to said compressed data memory said dictionary entry number of said longest match of said characters starting at said pointer with said sequences of characters stored in said pre-filled data compression dictionary.

61. A data decompression system which decompresses a compressed representation of a sequence of characters, said compressed representation comprising dictionary pointers to respective longest matches of sequences of characters starting at a pointer to particular characters within said sequence of characters with sequences of characters stored in a pre-filled data compression dictionary, said pre-filled data compression dictionary containing predetermined combinations of characters likely to occur frequently in said sequence of characters, said decompressing system comprising:

a compressed data memory for storing said compressed representation of said sequence of characters;

a decompressed data memory for storing said sequence of characters after decompression; and decompressing means for performing the steps of: (a) initializing a pointer to a first dictionary pointer in said compressed representation of said characters in said compressed data memory, (b) retrieving a dictionary entry from said pre-filled data compression dictionary using said dictionary pointer pointed to by said pointer, (c) storing said dictionary entry in said decompressed data memory as a decompressed representation of the characters making up said longest match, (d) moving said pointer to a next dictionary pointer in said compressed representation of said characters, and (e) repeating steps b–d for all dictionary pointers in said compressed representation of said characters in said compressed data memory until all compressed characters in said sequence of characters have been decompressed.

62. A system as in claim 61, wherein said decompressing means comprises means for extracting from said compressed representation of said characters in said compressed data memory at least one of: (1) the identity of the pre-filled data compression dictionary to use during decompression by said decompressing means, and (2) an indication of a Lempel-Ziv algorithm variant to be used to decompress said compressed representation of said characters in said compressed data memory.

63. A data decompression system which decompresses a compressed representation of a sequence of characters, said compressed representation comprising extension characters and dictionary entry numbers of respective longest matches of sequences of characters starting at a pointer to particular characters within said sequence of characters with sequences of characters stored in a pre-filled data compression dictionary and a data specific data compression dictionary, said extension character being that character in the sequence of characters which occurs after the longest match starting at said pointer, said pre-filled data compression dictionary containing predetermined combinations of characters likely to occur frequently in said sequence of characters, said data decompression system comprising:
 a compressed data memory for storing said compressed representation of said sequence of characters;
 a decompressed data memory for storing said sequence of characters after decompression; and
 decompressing means for performing the steps of: (a) initializing a data specific data decompression dictionary, (b) initializing a pointer to a first dictionary entry number in said compressed representation of said characters in said compressed data memory, (c) retrieving a dictionary entry and an extension character from one of said pre-filled data compression dictionary and said data specific data decompression dictionary using a dictionary entry number pointed to by said pointer, (d) storing said dictionary entry in said decompressed data memory as a decompressed representation of the characters making up said longest match,(e) selectively storing said characters making up said longest match and said extension character into said data specific data decompression dictionary, (f) moving said pointer to a next dictionary entry number in said compressed representation of said characters in said compressed data memory, and (g) repeating steps c–f for all dictionary entry numbers and extension characters in said compressed representation of said characters until all compressed characters in said sequence of characters have been decompressed.

64. A system as in claim 63, wherein said decompressing means further comprises means for extracting from said compressed representation of said characters in said compressed data memory at least one of: (1) an indication of the pre-filled data compression dictionary to use during decompression, (2) an indication of how dictionary address space is allocated between said data specific data compression dictionary and said pre-filled data compression dictionary, (3) an indication of a Lempel-Ziv algorithm variant to be used to decompress said compressed representation of said characters, and (4) an indication of what technique to follow when said data specific data compression dictionary becomes filled.

65. A data decompression system which decompresses a compressed representation of a sequence of characters, said compressed representation comprising window pointers and lengths of respective longest matches of sequences of characters in a character window having a pre-filled data compression dictionary appended thereto with a sequence of characters to be compressed, said pre-filled data compression dictionary containing predetermined combinations of characters likely to occur frequently in said sequence of characters, said data decompression system comprising:
 a compressed data memory for storing said compressed representation of said sequence of characters;
 a decompressed data memory for storing said sequence of characters after decompression; and
 decompressing means for performing the steps of: (a) initializing a pointer to a first window pointer and length in said compressed representation of said characters in said compressed data memory, (b) retrieving a number of characters determined by said length starting at a character within a current character window pointed to by a window pointer which is pointed to by said pointer, (c) storing said retrieved characters as a decompressed representation of the characters making up said longest match in said decompressed data memory, (d) moving said pointer to a next window pointer and length in said compressed representation of said characters in said compressed data memory, and (e) repeating steps b–d for all window pointers and lengths in said compressed representation of said characters until all compressed characters in said sequence of characters have been decompressed.

66. A system as in claim 65, wherein said decompressing means further comprises means for extracting from said compressed representation of said characters in said compressed data memory at least one of: (1) the identity of the pre-filled data compression dictionary to use during decompression, and (2) an indication of a Lempel-Ziv algorithm variant to be used to decompress said compressed representation of said characters.

67. A data decompression system which decompresses a compressed representation of a sequence of characters, said compressed representation comprising (1) window pointers and lengths of respective longest matches of sequences of characters starting at a pointer to particular characters within said sequence of characters with sequences of characters in a character window of a predetermined size and (2) dictionary entry numbers of respective longest matches of sequences of characters starting at said pointer to particular characters within a pre-filled data decompression dictionary, said pre-filled data compression dictionary containing predetermined combinations of characters likely to occur frequently in said sequence of characters, said data decompression system comprising:
 a compressed data memory for storing said compressed representation of said sequence of characters;
 a decompressed data memory for storing said sequence of characters after decompression; and decompressing means for performing the steps of: (a) initializing a pointer to a first entry in said compressed representation of said characters in said compressed data memory, (b) determining whether a current entry in said compressed representation of said characters pointed to by said pointer is (1) a window pointer and a length or (2) a dictionary entry number, (c) if said current entry in said compressed representation is a window pointer and a length, retrieving a number of characters determined by said length starting at a character within a current character window pointed to by said window pointer, (d) if said current entry in said compressed representation is a dictionary entry number, retrieving characters at a dictionary entry in said pre-filled data decompression dictionary identified by said dictionary entry number, (e) storing characters retrieved in steps c or d in said decompressed data memory as a decompressed representation of the characters making up the longest match for the current entry, (f) moving said pointer to a next entry in said compressed representation of said characters in said compressed data memory, and (g) repeating steps b–f for all entries in said compressed representation of said characters until all compressed characters in said sequence of characters have been decompressed.

68. A system as in claim 67, wherein said decompressing means further comprises means for extracting from said compressed representation of said characters in said compressed data memory at least one of: (1) the identity of the pre-filled data compression dictionary to use during decompression, and (2) an indication of a Lempel-Ziv algorithm variant to be used to decompress said compressed representation of said characters.

* * * * *